(12) United States Patent
Olieslagers et al.

(10) Patent No.: US 11,920,241 B2
(45) Date of Patent: Mar. 5, 2024

(54) FLUID HANDLING STRUCTURE AND METHOD FOR A GAS PHASE DEPOSITION APPARATUS

(71) Applicant: Nederlandse Organisatie voor toegepast-natuurwetenschappelijk onderzoek TNO, 's-Gravenhage (NL)

(72) Inventors: Ruud Olieslagers, Geldrop (NL); Jeroen Anthonius Smeltink, Mierlo (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 165 days.

(21) Appl. No.: 17/434,483

(22) PCT Filed: Mar. 24, 2020

(86) PCT No.: PCT/NL2020/050196
§ 371 (c)(1),
(2) Date: Aug. 27, 2021

(87) PCT Pub. No.: WO2020/197387
PCT Pub. Date: Oct. 1, 2020

(65) Prior Publication Data
US 2022/0145463 A1 May 12, 2022

(30) Foreign Application Priority Data
Mar. 26, 2019 (EP) .................................... 19165207

(51) Int. Cl.
*C23C 16/455* (2006.01)
(52) U.S. Cl.
CPC .. *C23C 16/45578* (2013.01); *C23C 16/45557* (2013.01)

(58) Field of Classification Search
CPC ........ C23C 16/45563; C23C 16/45557; C23C 16/45578
See application file for complete search history.

(56) References Cited

U.S. PATENT DOCUMENTS

| 2010/0116210 A1 | 5/2010 | Kato et al. |
| 2011/0088622 A1* | 4/2011 | Choi ..................... C23C 14/243 |
| | | 118/720 |

(Continued)

FOREIGN PATENT DOCUMENTS

| CN | 101736319 A | 6/2010 |
| CN | 103691623 A | 4/2014 |

(Continued)

OTHER PUBLICATIONS

Chinese Patent Office, First Office Action in corresponding Chinese Patent Application No. 202080024418.x dated Sep. 27, 2022.

(Continued)

*Primary Examiner* — Joseph A Miller, Jr.
(74) *Attorney, Agent, or Firm* — Leydig, Voit & Mayer, Ltd.

(57) ABSTRACT

A fluid handling structure for a gas phase deposition apparatus, the structure defining a flow path with an inlet and an outlet for transmitting pressurized fluid from said inlet to the outlet, wherein the structure includes an elongated slit and a series of nozzles through which pressurized fluid is allowed to enter the elongated slit, the inlet being upstream the series of nozzles, and wherein the outlet is formed downstream at a gap opening of the elongated slit allowing pressurized fluid to discharge from the elongated slit towards a substrate, wherein the series of nozzles are configured to provide a larger flow resistance than the elongated slit, and wherein the series of nozzles are adapted to form a series of jet flows directed towards one or more impingement surfaces of the (Continued)

structure when pressurized fluid is transmitted through the flow path.

20 Claims, 16 Drawing Sheets

(56) References Cited

U.S. PATENT DOCUMENTS

2017/0363948 A1  12/2017  Rops et al.
2018/0216227 A1   8/2018  Mazlout

FOREIGN PATENT DOCUMENTS

| CN | 103736606 A | 4/2014 |
|---|---|---|
| EP | 0377311 A1 | 7/1990 |
| EP | 3214205 A1 | 9/2017 |

OTHER PUBLICATIONS

European Patent Office, International Search Report in corresponding International Application No. PCT/NL2020/050196, dated Jul. 7, 2020 (3 pages).

Anuj K. Shukla et al., "Flow and Thermal Characteristics of Jet Impingement: Comprehensive Review," International Journal of Heat and Technology, vol. 35, No. 1, pp. 153-166, ISSN: 0392-8764 (Mar. 2017).

L.B.Y. Aldabbagh et al., "Effect of Jet-To-Plate Spacing in Laminar Array Jets Impinging," Heat Mass Transfer, No. 43, pp. 265-273 (2007).

E. Baydar et al., "An Experimental Investigation on Flow Structures of Confined and Unconfined Impinging Air Jets," Heat Mass Transfer, No. 42, pp. 338-346 (2006).

\* cited by examiner

FLUID HANDLING STRUCTURE AND METHOD FOR A GAS PHASE DEPOSITION APPARATUS

CROSS-REFERENCE TO RELATED APPLICATIONS

This patent application is a U.S. National Phase of PCT International Application No. PCT/NL2020/050196, filed Mar. 24, 2020, which claims priority to European Application No. 19165207.2, filed Mar. 26, 2019, which are both expressly incorporated by reference in their entireties, including any references contained therein.

FIELD OF THE INVENTION

The invention relates to a fluid handling for a gas phase deposition apparatus. The invention also relates to a fluid delivery head for use in a gas phase deposition system, and a gas phase deposition system including a fluid delivery head with the fluid handling structure. The invention further relates to a method for improving homogeneity of fluid flows produced for gas phase deposition on substrates. Further, the invention relates to a method for manufacturing a fluid handling structure for a gas phase deposition apparatus.

BACKGROUND TO THE INVENTION

A gas phase deposition technique is thin-film deposition used for providing a thin layer of material on a substrate or onto previously deposited layers. In most gas phase deposition techniques, a layer thickness can be controlled within a few tens of nanometers to several micrometers.

Atmospheric pressure large area gas phase deposition equipment, such as for instance spatial atomic layer deposition (ALD) or atmospheric pressure chemical vapor deposition (CVD), require an uniform gas flow over a width of the substrate, in order to avoid thickness non-uniformities caused by local variations of precursor flows. It is also important to improve separation of precursor gasses in ALD systems. This precursor separation function requires a controlled flow of N2 gas counteracting drag of precursor gas (caused by the substrate motion) and improving the separation. A commonly used way to achieve this is by arranging narrow slits with a high flow restriction. However, it is experienced that typically for large widths, slit widths variations due to manufacturing tolerances occur that are detrimental for uniform flow distributions, therefore also limiting upscalability. For instance, a slit with a clearance (i.e. outlet gap opening) of 100 micrometer may have relatively high clearance tolerances around 10 micrometer, which leads to a significantly non-uniform flow distribution up to 30 percent. In high throughput ALD systems, multiple ALD slot pairs can be used, ensuring the required throughput. In order to enhance a homogenous supply of gasses over multiple D slots, such slits need accurate dimensioning in terms of tolerance.

There is a need for providing a fluid handling apparatus for gas phase deposition that can provide a uniform supply of fluid and which can be easily manufactured e.g. with less stringent tolerances.

SUMMARY OF THE INVENTION

It is an object of the invention to provide for a fluid handling structure and a fluid handling method that obviates at least one of the above mentioned drawbacks.

Additionally or alternatively, it is an object of the invention to achieve improved flow uniformity during gas phase deposition.

Additionally or alternatively, it is an object of the invention to deposit a homogeneous layer in gas phase deposition, by means of a more even distribution of fluid gas over a surface during gas phase deposition.

Additionally or alternatively, it is an object of the invention to provide a fluid handling structure which can facilitate a more uniform flow of fluid throughout a gas phase deposition cycle.

Thereto, the invention provides for a fluid handling structure for a gas phase deposition apparatus, the structure defining a flow path with an inlet and an outlet for transmitting pressurized fluid from said inlet to the outlet, wherein the structure includes an elongated slit and a series of nozzles through which pressurized fluid is allowed to enter the elongated slit, the inlet being upstream the series of nozzles, and wherein the outlet is formed downstream at a gap opening of the elongated slit allowing pressurized fluid to discharge from the elongated slit towards, wherein the series of nozzles are configured to provide a larger flow resistance than the elongated slit, and wherein the series of nozzles are adapted to form a series of jet flows directed towards one or more impingement surfaces of the structure when pressurized fluid is transmitted through the flow path.

The nozzles are used as a main/primary restriction of the fluid flowing to the elongated slit. A more uniform flow discharge from the gap opening of the slit can be obtained thereby enabling the deposition of a more homogeneous layer during a gas phase deposition process. The fluid handling structure is less sensitive to manufacturing tolerances, as the nozzles suffer from lower manufacturing tolerances compared to slits. The nozzles can be manufactured in an accurate way. Furthermore, as the nozzles form the main restriction, a size of the gap opening of the elongated slit can be chosen larger, making it the discharged flow less sensitive to the manufacturing tolerances of the slit.

The nozzles are preferably configured to provide a flow resistance larger or equal than a flow resistance caused by the gap distance (IHGap) between the elongated slit and the substrate. In use, the nozzles are thus configured to control flow distribution within a controlled distance between injector head and substrate. The opening of elongated slit may then be chosen sufficiently large (e.g. 500 μm±10 μm) to become insensitive to typical manufacturing tolerances of ±10 μm on a slit inlet.

The nozzles which control flow distribution are located upstream of these elongated slit outlets where (1) the nozzle restriction may be dominant over entire flow path: this provides a substantially uniform flow that is quite independent on the distance (IHgap) between the slit and the substrate and circumstantial asymmetry in upstream supply restrictions or (2) the nozzle restriction may be substantially equal (e.g. in the order 0.5-1.5) of the restriction caused by the distance between the slit outlet and the substrate: in that case flow may be dependent on this distance in a linear fashion. This can be beneficial, for counteracting drag of gas by moving substrate, but it may also be sensitive to (upstream) asymmetry in flow restrictions (e.g bend, unequal supply lengths).

The nozzles thus provide a significantly higher restrictiveness than the elongated slit, i.e. the now of fluid passing through the nozzles is restricted to a greater degree than the flow of fluid passing through the elongated slit. The fluid going through the main flow path restriction forms a series of jet flows, which are directed such that they impinge on an impingement surface. The fluid passing through the elongated slit enables a more uniform discharging from the gap opening of the elongated slit.

The nozzles may be configured to enable the formation of jets in use, when pressurized fluid is guided through the flow path formed defined by the fluid handling structure. The series of nozzles may form a primary flow path restriction arranged at a fluid inlet portion of the fluid handling structure. The elongated slit may form a subsequent secondary flow path restriction. The gap opening may form a fluid outlet portion of the fluid handling structure, through which a substantially uniform flow of fluid can be discharged.

The series of nozzles (cf. primary flow path restriction) can provide a first pressure drop thereacross. This ensures a dominant pressure drop in the fluid handling structure that promotes uniformity. The elongated slit (cf. secondary flow path restriction) can provide a second pressure drop thereacross, significantly smaller than the dominant pressure drop achieved by the series of nozzles. This ensures a further pressure drop in the fluid handling structure that promotes further uniformity when the pressurized fluid transmitted through the flow path is discharged from the fluid handling structure. Optionally, the jets obtained by the nozzles are substantially non-parallel relative to a direction along the elongated slit and towards the gap opening.

The series of nozzles can be arranged for the intake of fluids in the elongated slit. Pressurized fluid guided through the series of nozzles is guided to the opening gap of the elongated slit after impinging the one or more impingement surfaces. In the flow path the dominant impedance is provided by the series of nozzles. The elongated slit may have a substantially lower impedance with respect to the impedance of the series of nozzles. Furthermore, the elongated slit may provide a capacitive effect beneficial for obtaining a more uniform flow output at the gap opening of the elongated slit.

Optionally, the series of nozzles are arranged at a first wall of the elongated slit, and wherein the impingement surfaces are arranged at a second wall of the elongated slit, the second wall being opposite the first wall.

The first wall and the second wall may be lateral walls defining the elongated slit through which fluid is allowed to flow. The elongated slit may form a part of the flow path formed by the fluid handling structure. The walls are spaced from each other with a gap therebetween. The gap is sufficiently large allowing fluid to flow towards the gap opening at an outer portion of the elongated slit. The first wall and the second wall are dimensioned to form an elongate slit, thereby forming an elongated gap opening. The gap opening is large enough such that it results in a smaller restriction than the plurality of nozzles arranged upstream in the flow path.

The series of nozzles may be formed by orifices, apertures or through holes. The nozzle holes can be manufactured with a small tolerance. For instance, the series of orifices can be obtained by accurately machining holes in a solid wall. The nozzles can provide a flow-dependent resistance.

The series of nozzles are configured to form downstream jet flows. If the fluid (gas) is directed directly towards the substrate, the high velocity of the gas coming out of the series of orifices may cause non-uniformities in the flow velocity. Instead the jets are directed to one or more impingement surfaces and further guided along the elongated slit towards a gap opening, thereby improving the uniformity of the gas flow discharged from the gap opening of the fluid handling structure.

In an example, the first wall and the second wall are substantially parallel with respect to each other. In this way, the gap between the first wall and the second wall can remain substantially constant in a downstream direction along the elongated slit.

It is also envisaged that the first wall and the second wall are non-parallel with respect to each other. For instance, the first wall and the second wall may be arranged such that the gap between the first wall and the second wall reduces towards the gap opening (Cf. tapered). The first wall and the second wall are arranged such that he restrictiveness provided by the elongated, slit and/or the gap opening remains smaller than the restrictiveness provided by the series of nozzles. The nozzle induced restriction therefore forms a dominant restriction in the flow path defined by the fluid handling structure.

The elongated slit includes an intermediate portion extending between the series of nozzles and the gap opening. This intermediate portion can have a capacitive effect such that the fluid flow can become more uniform as the gap opening is approached. Optionally, the elongated slit also includes a free portion extending in an opposite direction with respect to the direction towards the gap opening. This free portion may provide an additional capacitive effect resulting in a more uniform flow achieved at the gap opening.

Optionally, the series of nozzles are spatially offset with respect to each other in an array, and wherein the array substantially extends in a length direction of the elongated slit.

The series of nozzles may be arranged to substantially cover the total length of the gap opening of the elongated slit. In this way, the flow can be more evenly distributed over the length of the gap opening.

The uniformity of the fluid flow discharged through the opening gap of the elongated slit can be enhanced by providing a more uniform backpressure over an extended area of the elongated slit. Furthermore, the distance between the series of nozzles and the gap opening may be chosen such as to allow sufficient diffusing the flow of gas. Additionally or alternatively, additional means are provided in the elongated slit for obtaining better diffusion, e.g. rim wall.

The nozzles and the elongated slit may have a predetermined size. The fluid handling structure can be dimensioned such that the nozzles provide a significantly higher restriction than the elongated slit. The nozzles can thus form the main restriction in the flow path defined by the fluid handling structure. A jet flow with relatively high velocity can be obtained from each nozzle. This velocity can become more uniform as the jet flow is impinged on an impingement surface, e.g. on a wall of the elongated slit.

It will be appreciated that nozzles having a hole geometry can be more accurately manufactured than slits. However, a slit is preferred at the outlet of the fluid handling structure. Therefore, the hole-shaped orifices can provide accurately the desired back pressure.

The primary flow path restriction and the secondary flow path restriction formed by respectively the series of nozzles and the elongated slit with the gap opening, have different openings.

The pressurized fluid can flow from the high pressure end at the inlet to the low pressure end at the outlet. A pressure drop at the primary flow path restriction (series of nozzles) and the secondary flow path restriction (elongated slit) may create a pressure drop resulting in less discharge (rate of flow). The majority of the backpressure is generated by the series of nozzles forming the dominant restriction with a restrictiveness higher than the restrictiveness provided by the elongated slit. If the fluid is directed to the sample or substrate without the elongated slit, the high velocity of the fluid coming out of the nozzles may cause non-uniformities in the velocity profiles of the discharged fluid. The fluid handling structure with the series of nozzles and the elongated slit help to improve uniformity of the fluid flow discharged at the opening gap of said elongated slit.

At least one of the walls forming the elongated slit may be provided with the series of nozzles through which fluid is allowed to discharge inside the elongated slit. It is also envisaged that both walls are provided with series of nozzles. The series of nozzles may be formed by orifices manufactured by boring, perforation, etc.

Optionally, a first series of nozzles is arranged on a first lateral wall of the elongated slit, and a second series of nozzles is arranged on a second lateral wall of the elongated slit, the second lateral wall of the elongated slit being opposite the first lateral wall. The first series of nozzles and the second series of nozzles may be arranged such that contact between the opposing jets is substantially prevented. For this purpose, the first and second series of nozzles may be in a staggered arrangement with respect to each other. The formed jets can impinge the impingement surface on the opposing wall. The jets from the first and second series of nozzles may thus flow in opposite directions.

The series of nozzles can be spatially offset with respect to each other. For instance, the series of nozzles can be arranged next to each other (e.g. parallel arrangement) along one line or multiple lines. Furthermore, the series of nozzles can be distanced relative to each other in different ways. An array of nozzles can be arranged. Furthermore, it is also possible to arrange the series of nozzles in a matrix arrangement. Many variant nozzle arrangements are possible.

Optionally, the series of nozzles have a diameter in a range of 200 to 300 micrometer, and wherein the gap opening of the elongated outlet slit has a size substantially larger so that its resistance does not substantially contribute to a the flow path.

Optionally, each nozzle has a geometric flow area in a range of 0.03 to 0.07 square millimeter. The geometrical flow area of the series of nozzles is smaller than the geometrical flow area formed by the gap opening of the elongated slit.

The fluid handling structure facilitates a more uniform flow discharged from the gap opening of the elongated slit, thereby resulting in the formation of a more homogeneous layer in a gas phase deposition process. Therefore, the length of the gap opening of the elongated slit can be increased, while maintaining a desired uniformity of the fluid gas discharged over a surface of the substrate. Optionally, the elongated slit has a length in a longitudinal direction in a range of 10 to 200 millimeter.

If the gap opening is too wide, it may become too sensitive to distance variations between the sample/substrate and the gap opening. Such distance variations may also result from relative movement of the fluid handling device with respect to the sample surface.

A narrower gap can result in an improved uniformity. However, the restrictiveness provided by the elongated slit is to be smaller than the restrictiveness provided by the series of nozzles.

For example, if the nozzles have a diameter of 300 micrometer with a pitch of 1.25 mm, the flow discharged over the width of the gap opening of the elongated slit can vary significantly (e.g. 20 percent flow variation). If a fewer number of nozzles are arranged by increasing the pitch distance between the nozzles, the flow rate per nozzle can increase. As a result, the flow resistance can increase. If the nozzles have smaller diameters (e.g. 200 micrometer), the flow variation over the holes can be reduced. Hence, for smaller nozzle diameters, the resulting discharged fluid velocity profile can become more independent from the distance between the gap opening and the substrate/sample (wedge distance). Often this wedge distance varies, as the substrate is tilted or warped (for example as a result of manufacturing tolerances, thermal deformations, etc.).

Optionally, a distance between the series of nozzles and the gap opening is in a range of 1-50 millimeter, more preferably in a range of 2.5-25 millimeter, even more preferably in a range of 5-10 millimeter. In this way, the formation of a uniform flow at the discharge gap opening of the elongated slit may be improved.

Optionally, the series of nozzles and the gap opening are spaced in a range between 0.1-10 millimeter, more preferably in a range of 2.5-5 millimeter.

It can require a certain distance before a sufficient uniform flow is obtained. The series of nozzles are sufficiently distanced from the gap opening of the elongated slit in order to obtain a sufficiently uniformity flow of the fluid leaving the gap opening. The elongated slit may act as a capacitive member. The flow distribution can become more uniform within the slit as the gap opening is approached. The fluid velocity differences can be 'damped' or 'balanced out'.

Furthermore, fluid flow oscillations resulting from the resulting jet flow impinging on the impingement surface can be reduced. The fluid flow along the elongated slit towards the gap opening can become more uniformly streamlined, and turbulence from jets can break down upstream the gap opening.

The elongated slit may have a sufficient height in order to provide a sufficient damping to velocity differences, thereby providing a more uniform velocity profile of the flow discharged from the gap opening of the elongated slit.

Optionally, the second wall includes a series of cavities (e.g. potholes) arranged for receiving the formed jets when pressurized fluid is transmitted through the flow path, wherein the impingement surfaces are formed by the series of holes.

It is not desirable that the formed jets as a result of the dominant restriction provided by the series of nozzles are detectable in the velocity profiles of the fluid discharged through the gap opening of the elongated slit. The jets may be more visible in said velocity profiles at higher mass flows. This detrimental effect can be effectively reduced by means of a series of cavities, for example potholes—that may have any shape (circular, square etc.) and are preferably non-overlapping. The jet can be directed into a pothole cavity for dampening its detrimental effect on the uniformity of the flow at the gap opening. The pothole can have a larger diameter than the diameter of the nozzle, such that a continuous backflow in the opposite direction of the jet can be obtained. The fluid can then exit the pothole at a lower speed, so that the jets are less visible in the velocity profiles of the fluid discharged through the gap opening.

Optionally, the series of cavities on the second wall are arranged opposite the series of nozzles on the first wall.

The outflow of fluid coming from the nozzle can be forced towards an impingement surface. The impact of the jet on the impingement surface can break the jets down, such that the effect thereof on the velocity profiles of the fluid discharged through the gap opening, can be reduced.

Optionally, the cavities have a diameter in the same order as a nozzle diameter, e.g. typically 2-10 times a nozzle diameter. Typical dimensions are in a range of 0.5 to 2 millimeter, and a length in a range of 0.5 to 15 millimeter. A more even distribution of fluid discharged through the gap opening of the elongated slit may be obtained.

Optionally, the cavity has a depth of at least 1 millimeter, preferably at least 2 millimeter.

The arrangement of the one or more cavities (e.g. discrete orifices, one or more elongated grooves, potholes, etc.), can result in a more uniform flow discharged through the gap opening of the elongated slit. The cavities can for instance be manufactured by a milling process.

The main restriction is provided by the series of nozzles instead of the elongated slit. In this way, it may no longer be necessary to provide for elongated slits with a gap opening of less than 150 micrometer. For example, an elongated slit of 100 micrometer can suffer from manufacturing tolerances. According to the invention, the series of nozzles are placed before (cf. upstream) the elongated slit in the flow path. Within the elongated slit, the flow of fluid guided through the series of nozzles can be converted from jets to a uniform flow at the gap opening. Since the series of nozzles provide the dominant restriction in the flow path of the fluid handling device, the slit can be made wider, for example larger than 200 microns, more preferably larger than 350 microns, even more preferably larger than 400 microns. For example, a 10 micron variation (due to tolerances) for a 500 microns elongated slit has limited influence on the flow.

Optionally, the fluid handling structure includes at least one further second elongated slit arranged adjacent to a first elongated slit.

Optionally, the elongated slit includes means for breaking large vortices down to smaller ones. Thereby, the smaller vortices may dissipate faster downstream towards the gap opening of the elongated slit.

The means for breaking large vortices down into smaller ones may include at least one of a honeycomb structure, a netting, a mesh screen or an elongated settling zone. For example, a mesh screen can be provided in the flow path between the series of nozzles (cf. primary flow path restriction) and the elongated slit (cf. secondary flow path restriction). Additionally or alternatively, a porous material may be provided including a plurality of pores. A porous material having tiny pores can be used to create the desired backpressure. Porous materials are advantageous for providing a relatively simple unit that avoids difficulty machining of steel and the like.

Optionally, the nozzles are configured to direct the formed jets towards the second wall such as to substantially transversely impinge the impingement surface on the second wall.

Optionally, the nozzles have an adjustable diameter. It will be appreciated that the primary flow path restriction and/or the secondary flow path restriction may further include means for changing the flow resistance or restrictiveness. For example, said means may include a wire positioned within and traversing the orifice. The effective restrictiveness of the restriction (e.g. hole) may be increased by the insertion of a wire or other object having a diameter smaller than the diameter of the restriction. Additionally or alternatively, diameter adjusting means may also be used for changing a geometric flow area of a the primary flow path restriction and/or the secondary flow path restriction.

The series of nozzles and the elongated slit can be distanced from each other. The main/primary flow path restriction can thus be distanced from a secondary flow path restriction in the flow path defined by the fluid handling structure.

The gap opening of the slit enables discharge of fluid therethrough towards a substrate to be treated with fluid in a gas phase deposition process. It will be appreciated that the fluid handling structure can also be used for treating other samples.

Optionally, the fluid handling structure forms at least a portion of a gas phase deposition head, such as a chemical vapor deposition head or an atomic layer deposition head.

Optionally, the nozzles are arranged to provide a jet with an opening angle in a range between 1° to 30°, more preferably between 2° and 15°. In some cases, increasing the jet diameter and the number of nozzles can result in less velocity fluctuations.

Optionally, the fluid handling structure includes a plurality of elongated slits arranged in proximity to each other. The plurality of elongated slits may be arranged consecutively and/or next to each other. According to an aspect, the invention provides for a system including a plurality of fluid handling structures arranged next to each other.

According to an aspect, the invention provides for a fluid handling assembly including a plurality of fluid handling structures according to the invention. The plurality of fluid handling structures of the fluid handling assembly may be arranged successively after each other. Each of the plurality of fluid handling structures can be regarded a gas phase deposition slot providing a uniform flow distribution for gas phase deposition. The plurality of slots of the assembly may be housed in a head or held by a frame. The plurality of slots can successively pass over a surface for gas phase deposition. In this way, multiple layers can be deposited during a single stroke of the fluid handling assembly over the surface for gas phase deposition.

The plurality of slots can be arranged successively in a sequence. The succession of slots may be arranged transverse to a length direction A of the elongated slits of the slots (cf. next to each other in a relative moving direction S of the fluid handling assembly). The moving direction S can be seen as a direction in which the fluid handling structure is relatively movable with respect to the surface on which gas phase deposition is to be carried out. The slots of the assembly may be arranged adjacent each other, or spaced apart with respect to each other.

The inlet provides pressurized fluid to the slots. The pressurized fluid is provided to the series of nozzles of the slots, such that it can flow therethrough towards the elongated slit of the slot. The outlet of the flow path of the slot is formed by means of the gap opening of the elongated slit.

Optionally, a first group of slots of the plurality of slots may be in fluid communication with a common first inlet, and a second group of slots of the plurality of slots may be in fluid communication with a common second inlet. The first and second group of slots, and/or the first and second inlet may be different. Optionally, a further (e.g. third, fourth, fifth, etc.) group of slots of the plurality of slots are in fluid communication with a common further (e.g. third, fourth, fifth, etc.) inlet. Each group of slots may be used for depositing a different gas.

It will be appreciated that different arrangements of successive slots are possible. Also a different number of slots can be arranged successively after each other or next to each other. For example, the assembly may include a smaller number or larger number of individual slots. Additionally or alternatively, the assembly may have a different order or sequence of individual slots. Additionally or alternatively, the assembly may include a smaller or larger number of groups of slots.

The series of nozzles can form a dominant restriction in the flow path formed by the fluid handling structure. Advantageously, gasses can be uniformly distributed over the plurality of slots using the fluid handling structure according to the invention.

According to an aspect, the invention provides for a method for improving homogeneity of fluid flows for gas phase deposition on substrates, wherein a fluid is introduced using a fluid handling structure defining a flow path with an inlet and an outlet for transmitting pressurized fluid from said inlet to the outlet, wherein the structure is provided with an elongated slit and a series of nozzles through which pressurized fluid is allowed to enter the elongated slit, the inlet being provided upstream the series of nozzles, and wherein the outlet is formed downstream at a gap opening of the elongated slit allowing pressurized fluid to discharge from the elongated slit, wherein the series of nozzles are configured to provide a larger flow resistance than the elongated slit, and wherein the series of nozzles are adapted to form a series of jet flows directed towards one or more impingement surfaces of the structure when pressurized fluid is transmitted through the flow path.

As an example, the fluid flows may be formed by gas phase reactants or by inert purge gases that separate reactant gases.

A more uniform spatial flow distribution can be obtained since the fluid handling structure is less sensible for manufacturing tolerances. As a result, the fluid handling structure used in a gas phase deposition may be less susceptible to inhomogeneous flow zones by impinging jets. An improved distribution of gasses over injectors can be obtained, as dominant nozzle restrictions can be made accurately. Furthermore, shorter purge slot lengths may be required, since uniform outflow condition can be obtained inside inlet slit section.

The inlet of the fluid handling structure can be in fluid communication with one or more inlet chambers. The series of nozzles can be positioned between the inlet chamber and the elongated slit. The fluid handling structure can be configured to provide a flow path in which the fluid flow can be regulated, wherein it is prevented that nozzles or a slit directly blows the fluid onto the substrate. Instead, the main restriction in the flow path is arranged upstream at the series of nozzles.

According to an aspect, the invention provides for a method for handling fluid in a gas phase deposition apparatus, the method including the steps of: defining a flow path through which pressurized fluid is allowed to flow, the flow path having an inlet, a series of nozzles, an elongated slit and an outlet, wherein the inlet is upstream relative to the series of nozzles, and wherein the outlet is formed downstream at a gap opening of the elongated slit; supplying a pressurized fluid to the inlet of the flow path, the series of nozzles being configured to form a series of jets; directing the series of jets into the elongated slit; and impinging, within the elongated slit, the formed series of jets against an impingement surface; wherein the series of nozzles are configured to provide a larger flow resistance than the elongated slit, and wherein the series of nozzles form a dominant restriction within the flow path.

The above method for handling fluid in a gas phase deposition apparatus provides a way to obtain a more uniform flow discharge. In use, pressurized fluid is provided to the inlet, generating a fluid flow. The flow path of the fluid handling structure are arranged and dimensioned to provide the desired flow characteristics.

Optionally, the fluid handling device is also used for providing a gas/air hearing function. In this way, the design of the gas phase deposition system can be simplified as two functions are combined in one device.

According to an aspect, the invention provides for a method for manufacturing a fluid handling structure according to the invention, the method including the steps of: providing a series of nozzles in a first wall, forming a slit by means of arranging the first wall adjacent a second wall with a spacing therebetween, the formed slit defining a gap opening through which pressurized fluid can discharge, and arranging an inlet chamber upstream the series of nozzles.

The fluid handling structure can improve the uniformity of the gas flow discharged from the fluid handing structure when pressurized fluid is transmitted therethrough.

The nozzles can be formed by orifices spaced apart in a longitudinal direction of the elongated slit. The nozzles may be distributed over a total length of the elongated slit.

The series of nozzles may be arranged in the first wall by means of boring holes or orifices therein.

In an advantageous example, one or more cavities are arranged in the second wall, aligned in such a way with the plurality of nozzles that the jets are directed towards such one or more cavities. Optionally, each nozzle has a respective cavity. Additionally or alternatively, one or more elongated slits may be used for receiving two or more jets coming from two or more nozzles. It will be clear to the skilled person that various arrangements are possible.

Optionally, a series of cavities are arranged in the second wall, the series of cavities being positioned opposite the series of nozzles.

Optionally, the fluid handling structure is made of two units, a first unit including the first wall, and a second unit including the second wall, wherein the first unit is attached to the second unit for forming the elongated slit. The series of nozzles can be arranged in the first wall. Optionally, a series of cavities are arranged in the second wall, such that when the first unit is attached to the second unit, the series of cavities are opposite the series of nozzles. It is also envisaged that the one or more elongated grooves are employed instead of a series of discrete cavities. In this way the manufacturing process can be significantly simplified. Furthermore, alignment of fluid jets coming from the nozzles with the one or more cavities can be facilitated in this way.

According to an aspect, the invention provides for a fluid delivery head for use in a gas phase deposition system, the fluid delivery head, including the fluid handling structure according to the invention.

The fluid handling device can be used in a gas phase deposition process, for instance involving providing at least one of a deposit gas or separation gas.

According to an aspect, the invention provides for a gas phase deposition system including a fluid delivery head with the fluid handling structure according to the invention.

The fluid handling structure provides a uniform fluid flow output whilst being less sensitive to manufacturing tolerances of the gap opening of the elongated slit (e.g. in a range of 10 micrometer).

A high throughput gas phase deposition system can be obtained by arranging multiple elongated slits. In this way, a required throughput for gas phase deposition can be ensured.

The series of nozzles can provide a primary flow path restriction in the flow path. The pressure drop thereacross can result in a dominant pressure drop in the fluid handling structure that promotes uniformity. The elongated slit can provide a secondary flow path restriction. The pressure drop thereacross is significantly smaller than the dominant pressure drop achieved by the series of nozzles. By means of the elongated slit, further uniformity of the flow can be achieved when the pressurized fluid transmitted through the flow path is discharged from the fluid handling structure.

According to an aspect, the invention provides for a fluid handling structure for a gas phase deposition apparatus, the structure defining a flow path with an inlet and an outlet for transmitting pressurized fluid from said inlet to the outlet, wherein the structure includes a first elongated slit and a first series of nozzles through which pressurized fluid is allowed to enter the first elongated slit, and a second elongated slit and a second series of nozzles through which pressurized fluid is allowed to enter the second elongated slit, the inlet being upstream the first series of nozzles and second series of nozzles, and wherein the outlet is formed downstream at a first and second gap opening of respectively the first and second elongated slit allowing pressurized fluid to discharge from the first and second elongated slit towards a substrate, wherein the first and second series of nozzles are configured to provide a larger flow resistance than respectively the first and second elongated slit, and wherein the first and second series of nozzles are adapted to form a respectively first and second series of jet flows directed towards one or more first and second impingement surfaces of the structure when pressurized fluid is transmitted through the flow path of the fluid handling structure. The outlet of the flow path may be formed by the first and second elongated slits. The flow from the inlet can be branched off into the first and second elongated slit.

Optionally, the first and second elongated slits are arranged next to each other transverse to a length direction of the first and second elongated slits, e.g. in a moving direction of the fluid handling structure. The moving direction is a direction in which the fluid handling structure is movable for treating gas phase deposition. By arranging a plurality of elongated slits next to each other the throughput can be significantly improved, while obtaining a uniform flow distribution by means of each elongated slit. Optionally more than two elongated slits are arranged next to each other transverse to a length direction of the first and second elongated slits.

Optionally, the first and second elongated slits are arranged next to each other in a length direction of the first and second elongated slits, e.g. transverse to a moving direction of the fluid handling structure. In this way a larger area can be covered when the fluid handling structure is moved in the moving direction. The first and second elongated slits can be positioned adjacent each other. Optionally, nozzles are arranged closer together near a sidewall of the elongated slit. A sidewall of the first elongated slit may for instance be positioned next to a sidewall of the second elongated slit. By arranging the nozzles closer together, the reduced flow output at these sides can be compensated. It is also envisaged that one sidewall is employed between the first and second elongated slits. The first and second elongated slits may share a sidewall when arranged next to each other in a direction transverse to a moving direction of the fluid handling structure. The moving direction may be transverse to the length direction of the first and second elongated slits. Optionally more than two elongated slits are arranged next to each other transverse to the moving direction of the fluid handling structure or in a length direction of the first and second elongated slits.

According to an aspect, the invention provides for a fluid handling structure for a gas phase deposition (e.g. ALD, CVD, etc.) apparatus, the structure defining a flow path with an inlet and an outlet for transmitting pressurized fluid from said inlet to the outlet, wherein the structure includes an elongated slit and a series of orifices through which pressurized fluid is allowed to enter the elongated slit, the inlet being upstream the series of orifices, and wherein the outlet is formed at a gap opening of the elongated slit allowing pressurized fluid to discharge from the elongated slit, wherein the series of orifices are configured to provide a larger flow resistance (cf. restrictiveness) than the elongated slit, and wherein the series of orifices are adapted to form a series of jet flows directed towards one or more impingement surfaces of the structure when pressurized fluid is transmitted through the flow path.

It will be appreciated that a further flow path restriction may be arranged within the elongated slit, although having a smaller resistance or restrictiveness than the primary flow path restriction. For instance, the further flow path restriction may be arranged at or near the gap opening of the elongated slit (fluid outlet of the fluid handling structure).

According to an aspect, the invention provides for a method of improving the homogeneity of films produced by gas phase deposition on substrates in a selected reaction zone comprising the steps of: placing said substrates in said selected reaction zone; introducing at least one film-forming reactant in gaseous form to said reaction zone so as to induce chemical vapor deposition of a film on each of said substrates; removing excess gaseous film-forming reactant(s) from said reaction zone by means of a suction force created by a jet stream of a carrier gas, and recycling at least part of said excess gaseous film-forming reactant(s) to said reaction zone together with said carrier gas, wherein the at least one film-forming reactant is introduced using the fluid handling structure according to the invention. The method can significantly improve the homogeneity of films produced by means of gas phase deposition (e.g. ALD and/or CVD) on substrates It will be appreciated that next to ALD and CVD, the fluid handling structure according to the invention can be used for other or similar gas phase deposition techniques known in the art. It will be appreciated that for chemical vapor deposition, the fluid can be at least one of a gas or vapor.

According to an aspect, the invention provides for an assembly including a first fluid handling structure and a second fluid handling structure, wherein the first and second fluid handling structures are arranged next to each other. Advantageously, the throughput of the fluid handling assembly for gas phase deposition can be improved.

Optionally, the first and second fluid handling structures of the assembly are arranged such that a first elongated slit of the first fluid handling structure and a second elongated slit of the second fluid handling structure are positioned successively in sequence, transverse to a length direction of the elongated slits. The length direction can be transverse to a relative moving direction of the assembly with respect to a to be treated surface (for gas phase deposition). The gas phase deposition can be improved in this way, while keeping an uniform flow distribution, e.g. over the slots, obtained by the fluid handling structures.

It is also envisaged that fluid handling structures of the assembly are arranged next to each other in a length direction of the elongated slits. In this way, additionally a larger area can be covered by the assembly.

It will be appreciated that any of the aspects, features and options described in view of the fluid handling structure apply equally to the methods and the described fluid delivery head, the assembly and the gas phase deposition system. It will also be clear that any one or more of the above aspects, features and options can be combined.

BRIEF DESCRIPTION OF THE DRAWING

The invention will further be elucidated on the basis of exemplary embodiments which are represented in a drawing. The exemplary embodiments are given by way of non-limitative illustration. It is noted that the figures are schematic representations of embodiments of the invention that are given by way of non-limiting example.

In the drawing.

DETAILED DESCRIPTION

Figure 1:
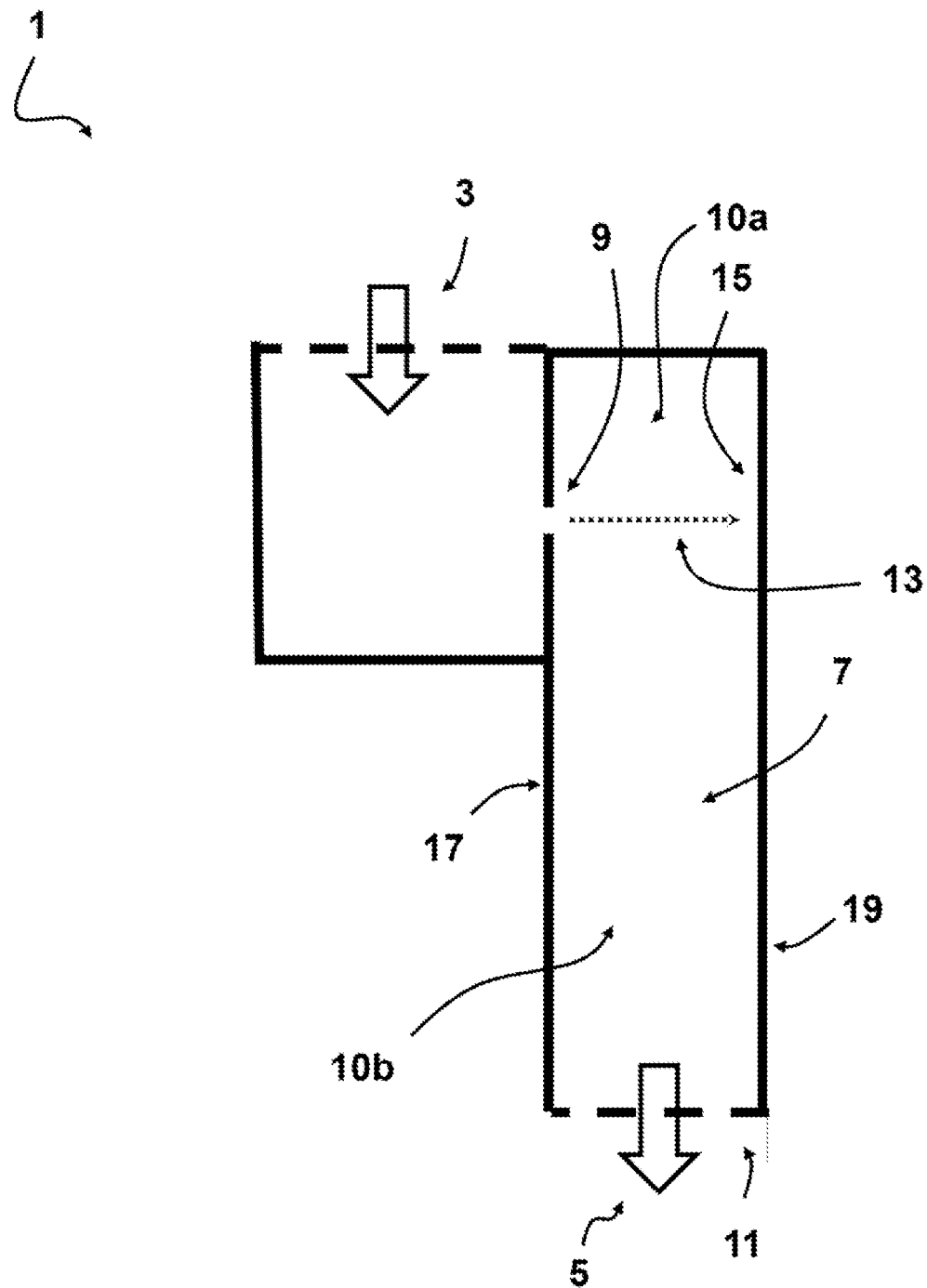
FIG. 1 shows a cross sectional view of a schematic diagram of an embodiment of a fluid handling structure.

FIG. 1 shows a cross sectional view of a schematic diagram of an embodiment of a fluid handling structure 1 for a gas phase deposition apparatus. The structure 1 defines a flow path with an inlet 3 and an outlet 5 for transmitting pressurized fluid from said inlet 3 to the outlet 5. The structure 1 includes an elongated slit 7 and a series of nozzles 9 (only one visible in this cross section) through which pressurized fluid is allowed to enter the elongated slit 7. The inlet 3 of the fluid handling structure 1 is positioned upstream the series of nozzles 9 in the flow path. defined by said fluid handling structure 1. The outlet 5 is formed downstream in the flow path, at a gap opening 11 of the elongated slit 7, through which pressurized fluid is allowed to discharge from the elongated slit 7. The series of nozzles 9 are configured to provide a larger flow resistance than the elongated slit 7. The series of nozzles 9 are adapted to form a series of jet flows 13 directed towards one or more impingement surfaces 15 of the structure 1 when pressurized fluid is transmitted through the flow path.

The resulting uniform distribution of gas obtained by means of the gas handling structure allows improved uniformity of deposition growth as well as, i.e. better layer deposition better homogeneity. The fluid handling structure 1 exploits the benefits of nozzles 9, having good manufacturability, while excluding impingement zones at substrate level. Additionally, dependency on slit tolerances in the fluid handling structure 1 design is also reduced.

In this example, the series of nozzles 9 are arranged at a first wall 17 of the elongated slit 7. The impingement surfaces 15 are arranged at a second wall 19 of the elongated slit 7. The second wall 19 is positioned opposite the first wall 17.

In the shown example, the elongated slit includes an intermediate portion 10a extending between the series of nozzles 9 and the gap opening 11. This intermediate portion 10a can have a capacitive effect such that the fluid flow can become more uniform as the gap opening is approached. Further, the elongated slit 7 also includes an optional free portion 10b extending in an opposite direction with respect to the direction towards the gap opening 11. This free portion 10b may provide an additional capacitive effect resulting in a more uniform flow achieved at the gap opening.

In the drawings, which are not necessarily drawn to scale, like numerals may describe similar components. A detailed explanation as to these elements may be omitted.

Figure 2:
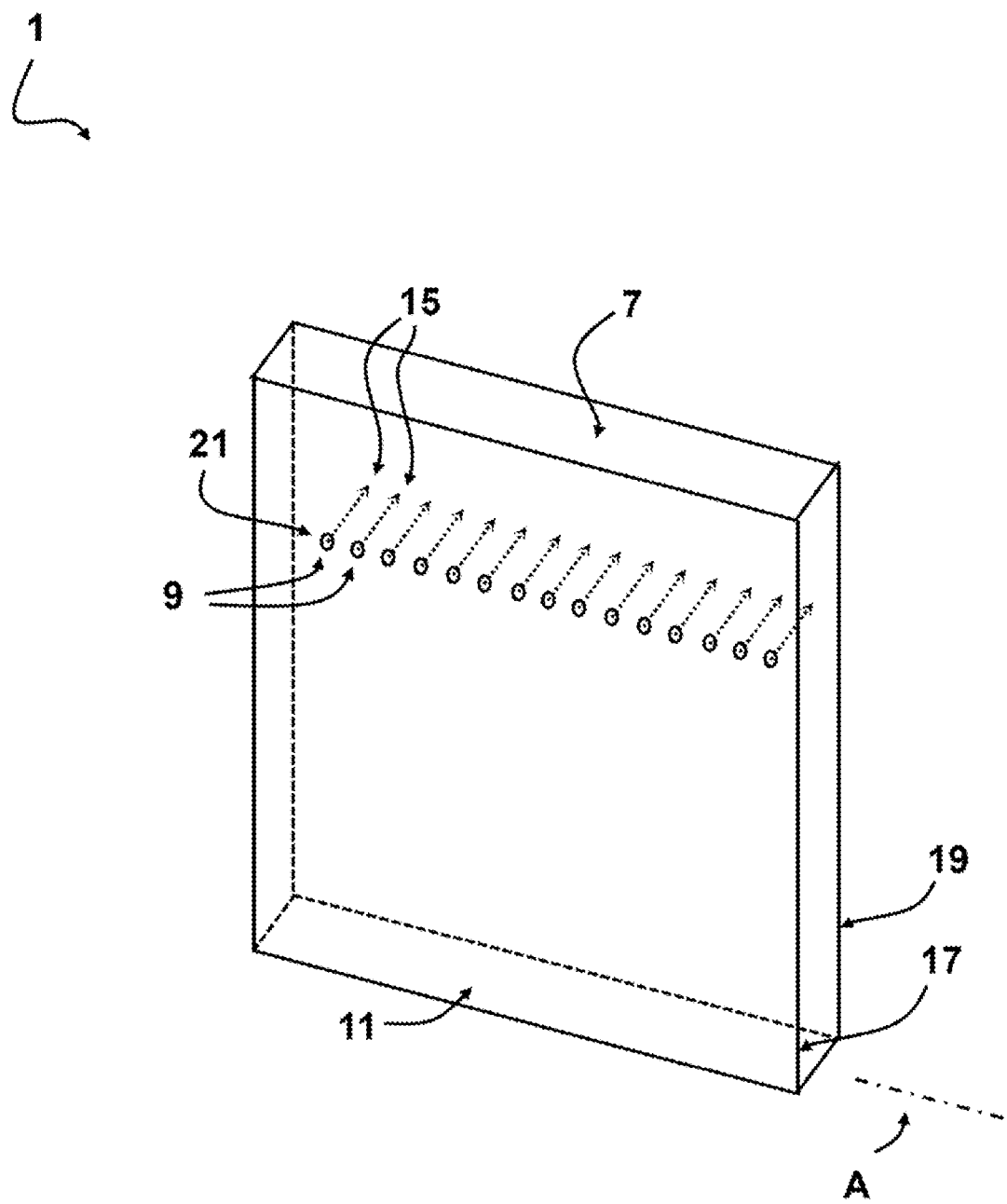
FIG. 2 shows a perspective view of a schematic diagram of an embodiment of a fluid handling structure.

FIG. 2 shows a schematic diagram of an embodiment of a fluid handling structure 1 in perspective view. The fluid handling structure 1 is configured to output a uniform flow distribution. The structure 1 can include a discharge chamber formed by the elongated slit 7. The discharge chamber has an inlet and an outlet, wherein the inlet is formed by a series of nozzles 9 (e.g. apertures or orifices) arranged in a first wall 17, and wherein the outlet is formed by an gap opening 11 of the elongated slit 7 distanced from the series of nozzles 9. The series of nozzles 9 are dimensioned to enable, in use, the formation of a jet, and wherein the discharge chamber is arranged such that the jet 13 formed by the series of nozzles impinge on a surface of a second wall 19 opposite the first wall 17.

The series of nozzles 9 are spatially offset with respect to each other in an array 21. The array 21 substantially extends in a length direction A of the elongated slit 7. In this example, the formed jets 13 are impinged on impingement surfaces 15 on the second wall 19 of the structure 1. The gap opening 11 of the elongated slit 7 has a size substantially equal to a distance between the first wall 17 and the second wall 19.

The series of nozzles may create a high speed stream of fluid on its downstream side (cf. jets 13). The elongated slit 7 can be disposed in the flow path downstream of the location of the series of nozzles 9. It is desired that the effect of such jet flows are not characterized in the velocity profiles of the fluid discharged through the gap opening 11 of the elongated slit 7. The secondary flow path restriction provided by the elongated slit 7 may provide a significantly lower pressure drop compared to the restriction provided by the series of nozzles 9.

The series of nozzles 9 provide a primary flow path restriction which can be seen as the main or dominant flow path restriction in the flow path defined by the fluid handling structure 1. The elongated slit 7 may provide a secondary flow path restriction having a significantly lower restrictiveness than the primary flow path restriction provided by the series of nozzles 9. The secondary flow path restriction is positioned downstream of a location of the main flow path restriction.

The fluid inlet of the fluid handling structure 1 may provide a fluid at a higher pressure to the series of nozzles 9. The fluid can then be guided along the secondary flow path restriction formed by the elongated slit 7. The primary flow path restriction results in the greatest pressure drop and guide the fluid towards the outlet to a lower pressure region at the surface of the sample or substrate (not shown).

The nozzle holes are sufficiently small with respect to the size of the gap opening for back-pressure generation. Preferably the holes are smaller than 400 micrometer, more preferably smaller than 300 micrometer. By choosing the holes small enough a uniform flow is obtained, which is less dependent on the width of the gap opening. The nozzles and the cavities (e.g. potholes) can be manufactured by drilling holes. Other manufacturing processes may also be used. It is also envisaged that an elongated groove is employed instead of multiple cavities.

Figure 3:
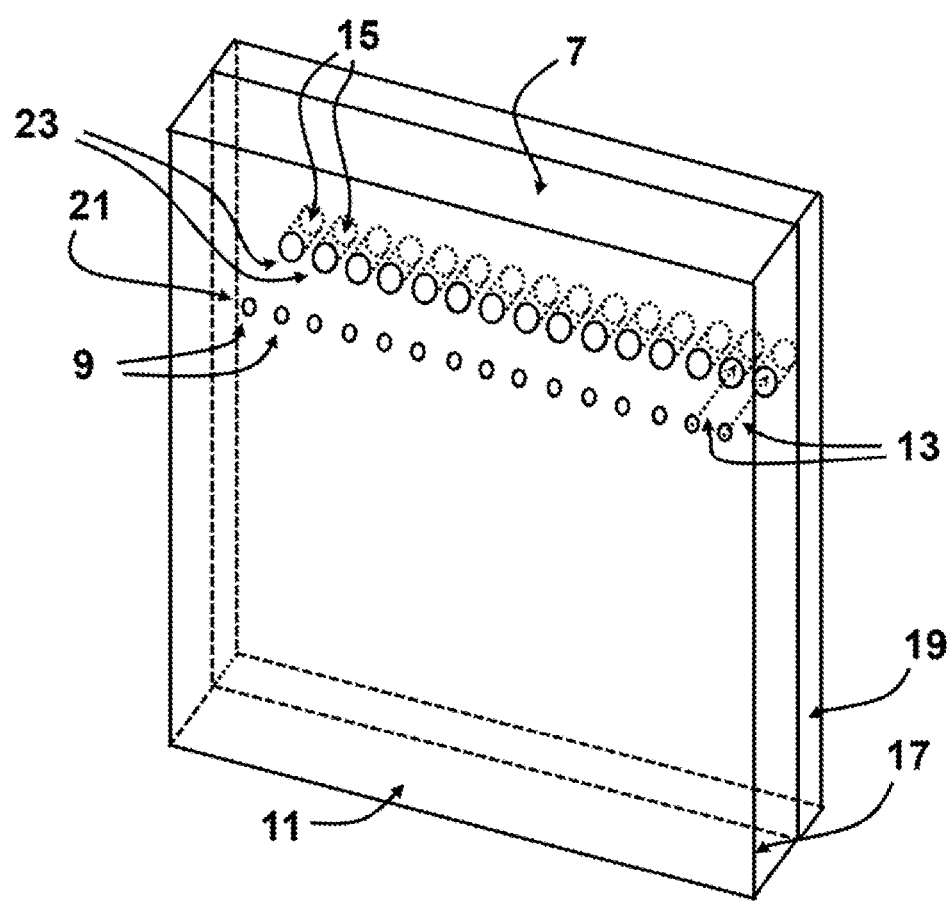
FIG. 3 shows a perspective view of a schematic diagram of an embodiment of a fluid handling structure.

FIG. 3 shows a perspective view of a schematic diagram of an embodiment of a fluid handling structure 1. The second wall 19 includes a series of potholes 23 (cavities) arranged for receiving the formed jets 13 when pressurized fluid is transmitted through the flow path. The impingement surfaces 15 are formed by the respective series of potholes 23. The series of potholes 23 on the second wall 19 are arranged opposite the series of nozzles 9 on the first wall 17.

In this example, the potholes 23 are formed by circular borings in the second wall 19 opposite the first wall at which the nozzles 9 are arranged. The potholes 23 may be shaped and dimensioned to receive the jets formed by the plurality of nozzles during use, when pressurized fluid is guided through the fluid handling device 1.

The potholes 23 may have different forms and shapes. Also a different number of potholes may be arranged. For example, one pothole can be used for receiving a plurality of formed jets 13 coming from the nozzles 9. It is also possible to form one or more pothole slits or grooves instead of circular potholes. The one or more pothole slits of grooves may be arranged opposite the array 21, extending along the length of the array. Optionally, the pothole has a maximum lead diameter of at least 0.5 millimeter, preferably at least 1 mm.

It is relatively easy to manufacture a wall with potholes having a circular boring. It is also possible to accurately (cf. tolerance) produce the borings. The manufacturing costs for the fluid handling structure can thus be reduced.

The primary flow path restriction formed by the series of nozzles 9 provides a flow restriction of greatest magnitude and can be considered as the dominant restriction. The primary flow path restriction may be provided between a higher pressure first region in the inlet chamber and a lower pressure region surrounded by the elongated slit 7. The secondary restriction formed by the elongated slit 7 provides a flow restriction of a smaller magnitude and can be considered as a non-dominant restriction in the structure 1. The secondary flow path restriction is distinct from the primary flow path restriction.

FIGS. 4a-4d show a cross sectional view of a schematic diagram of embodiments of a fluid handling structure 1. The fluid handling structure 1 may include a supply chamber in fluid connection with the plurality of nozzles 9 in the flow path. Various dimensions, shapes and arrangement of nozzles 9 can be employed for providing fluid communication between the supply chamber and the elongated slit 7. The nozzle diameter can be chosen such that this restriction is dominant over all other restrictions in the flow path defined by the fluid handling structure 1. Optionally, the nozzles 9 have a diameter smaller than 400 1.5 micrometer, more preferably smaller than 300 micrometer. An uniform distribution of gas can be achieved. Moreover, the nozzles 9 can be manufactured more accurately than slits. A width of the gap opening (clearance of slit) can be chosen sufficiently large to become less dependent of manufacturing tolerances. After having passed the nozzle section, the fluid can impinge on the one or more impingement surfaces 15. The one or more impingement surfaces 15 can be arranged at opposing inlet wall side, finally realizing an uniform outflow condition towards the purge/precursor gap.

Figure 4A:
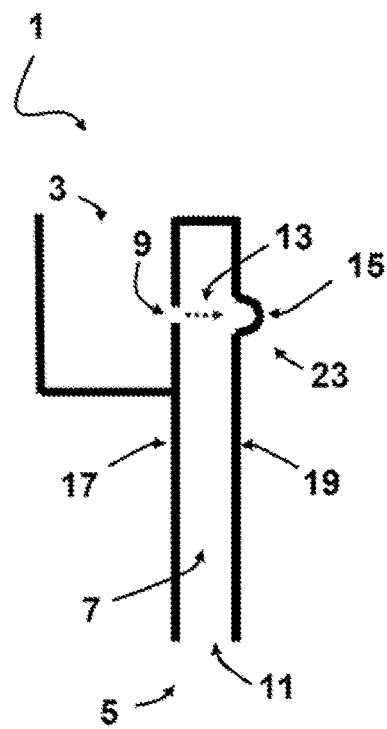
FIGS. 4a-4d show a cross sectional view of a schematic diagram of embodiments of a fluid handling structure.
Figure 4B:
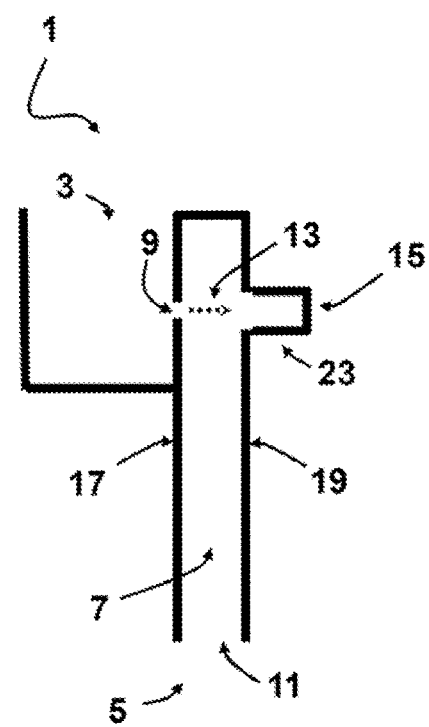
Figure 4C:
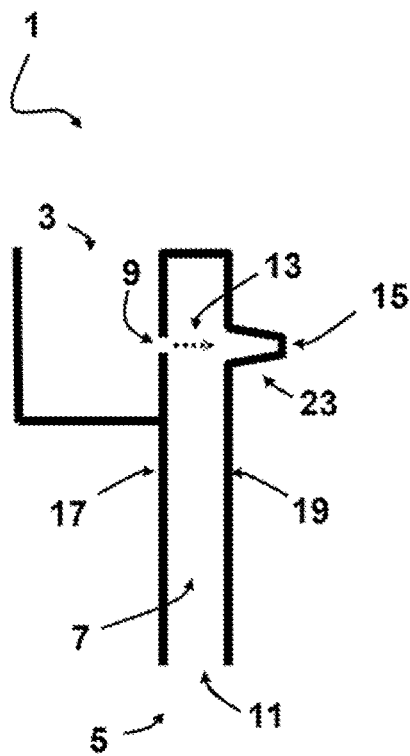
Figure 4D:
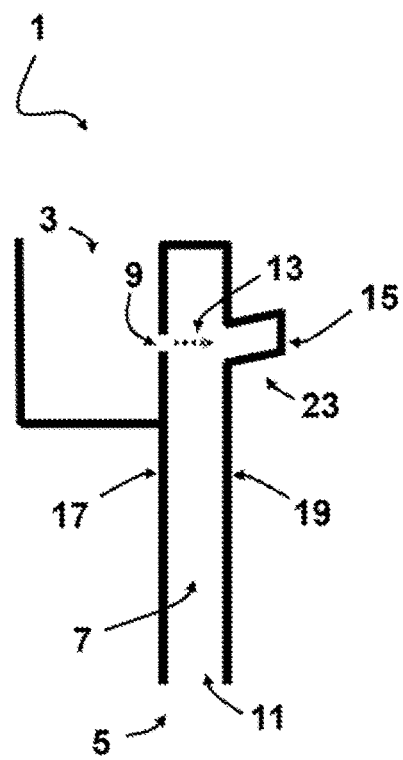

Each embodiment of FIGS. 4a-4d has a different type of pothole 23. In FIG. 4a, the pothole forms a concave impingement surface 15. In FIG. 4b, the pothole is formed by a straight hole/boring. In FIG. 4c, the pothole is formed by a tapered hole. In FIG. 4d, the hole is inclined. The potholes 23 can effectively improve reduce the effect of the jets 13 on the velocity profiles of fluid discharged from the gap opening 11 of the elongated slit 7.

Figure 5A:
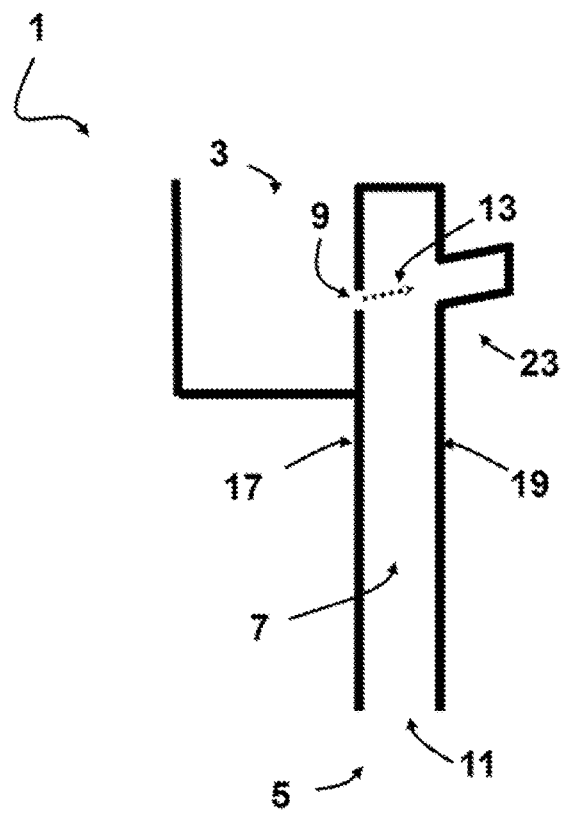
FIGS. 5a and 5b show a cross sectional view of a schematic diagram of an embodiment of a fluid handling structure.
Figure 5B:
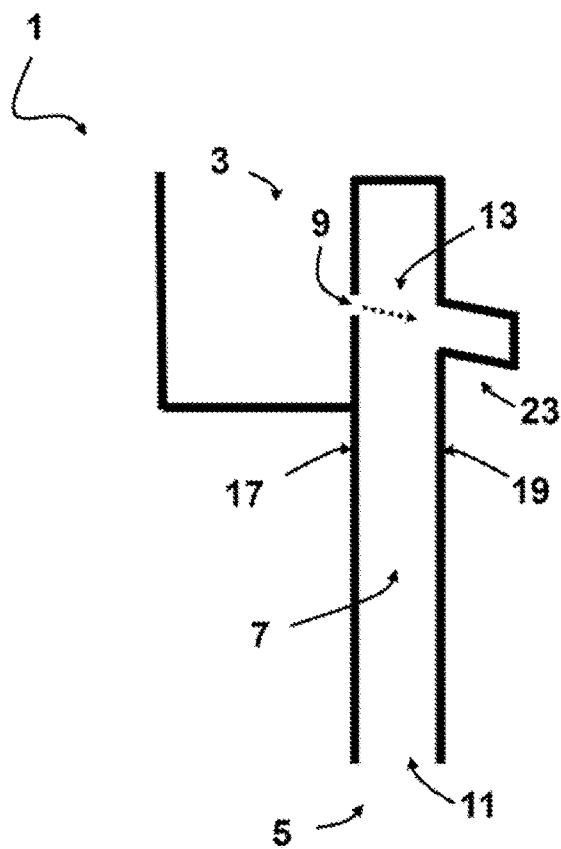

FIGS. 5a and 5b show a cross sectional view of a schematic diagram of an embodiment of a fluid handling structure 1. In this example, the potholes 23 are inclined. In FIGS. 5a and 5b, the potholes 23 are respectively inclined upward and downward. Furthermore, the nozzles 9 are configured to form jets under an inclined angle substantially corresponding to the inclination of the potholes 23. In this way, the angled jets can be better directed towards the potholes 23. The embodiments of FIGS. 5a and 5b can also be combined, for instance alternatingly using upward and downward inclined potholes 23 for nozzles of the series of nozzles 9. The potholes 23 may result in a more uniform velocity profile at the gap opening 11 of the elongated slit 7.

Figure 6:
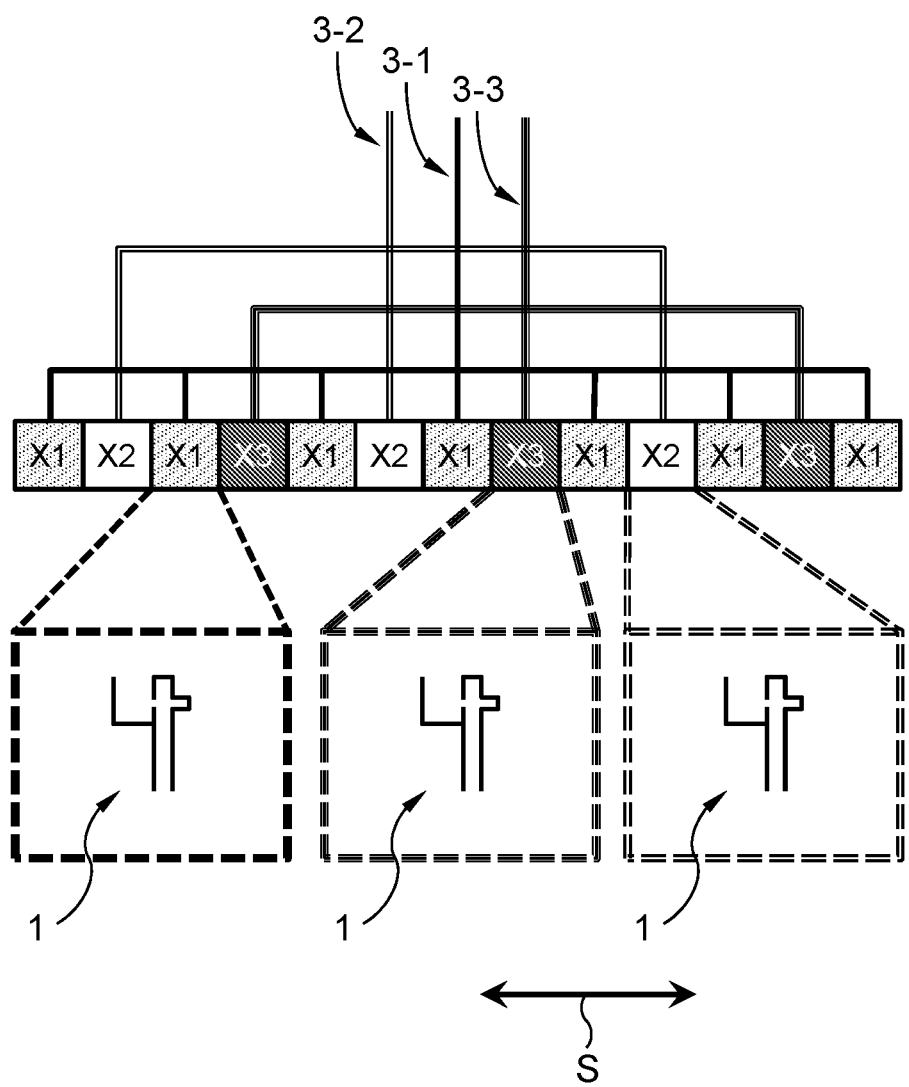
FIG. 6 shows a schematic diagram of an embodiment of a fluid handling assembly.

FIG. 6 shows a schematic diagram of an embodiment of a fluid handling assembly including a plurality of fluid handling structures according to the invention. The obtained throughput of the gas phase deposition (e.g. ALD) can be significantly increased. Each fluid handling structure can be seen a gas phase deposition slot. The assembly includes multiple slots arranged successively after each other. The slots can successively pass over a surface for gas phase deposition. In this way, multiple layers can be deposited during a single stroke of the fluid handling assembly over the surface for gas phase deposition.

Advantageously, a uniform flow distribution can be obtained through each slot of the fluid handling assembly. The series of nozzles can be arranged for ensuring that the gas is distributed evenly over the slots. For example, a proportional supply of 100 slm may be provided over 10 slots. Each slot can receive 10 slm. Other arrangements are also possible. The series of nozzles can form a dominant restriction in the flow path formed by the fluid handling structure (compared to the restriction provided by the elongated slit of the fluid handling structure). Advantageously, gasses can be uniformly distributed over the plurality of slots using the fluid handling structure according to the invention.

The series of nozzles can be arranged for the intake of pressurized fluid in the elongated slit. Pressurized fluid guided through the series of nozzles is guided to the opening gap of the elongated slit after impinging the one or more impingement surfaces. In the flow path the dominant impedance is provided by the series of nozzles. The elongated slit may have a substantially lower impedance with respect to the impedance of the series of nozzles. Furthermore, the elongated slit may provide a capacitive effect beneficial for obtaining a more uniform flow output at the gap opening of the elongated slit.

The plurality of slots can be arranged in sequence transverse to a length direction A of the elongated slits of the slots (cf. next to each other in a relative moving direction S of the fluid handling assembly). The moving direction S is a direction in which the fluid handling structure is relatively movable with respect to the surface on which gas phase deposition is to be carried out.

A first group of slots of the plurality of slots may be in fluid communication with a common first inlet, and a second group of slots of the plurality of slots may be in fluid communication with a common second inlet. It is also possible that a further (e.g. third, fourth, etc.) group of slots of the plurality of slots are in fluid communication with a common further inlet. The inlet provides pressurized fluid to the slots. The pressurized fluid is provided to the series of nozzles of the slots, such that it can flow therethrough towards the elongated slit of the slot. The outlet of the flow path of the slot is formed by means of the gap opening of the elongated slit.

Different arrangements of successive slots are possible. Also a different number of slots can be arranged successively after each other or next to each other.

In the shown embodiment in FIG. 6, a first group of slots X1 are arranged for depositing a first gas (e.g. including N2), a second group of slots X2 are arranged for depositing a second gas (e.g. including oxide), and a third group of slots X3 are arranged for depositing a third gas (e.g. including a metal). The first group of slots has a common first inlet 3-1, the second group has a common second inlet 3-2 and the third group has a third common inlet 3-3. Although the inlet is depicted with a line, this can be a fluid line, a chamber, a channel, etc. In the shown example, the slots or fluid handling structures of the fluid handling assembly include optional cavities (e.g. potholes). In this example, the assembly includes the following successive slots X1-X2-X1-X3-X1-X2-X1-X3-X1-X2-X1-X3-X1. However, many other configurations are possible. For example, the assembly may include a smaller number or larger number of individual slots. Additionally or alternatively, the assembly may have a different order or sequence of individual slots. Additionally or alternatively, the assembly may include a smaller or larger number of groups of slots.

Figure 7A:
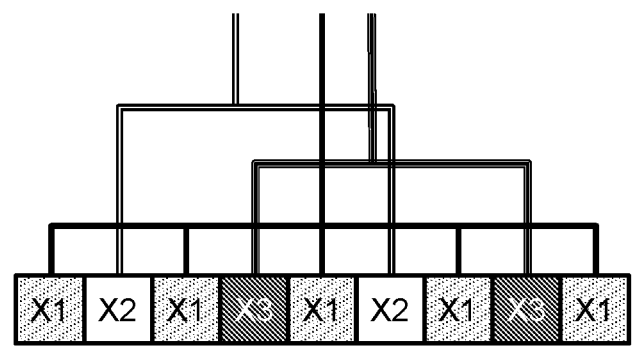
FIGS. 7a, 7b and 7c show a schematic diagram of an embodiment of a fluid handling assembly.
Figure 7B:
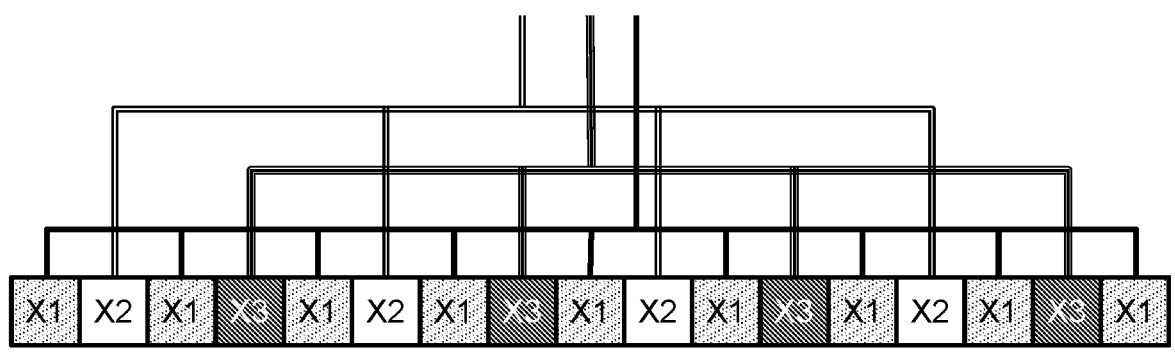

FIGS. 7a and 7b show a schematic diagram of an embodiment of a fluid handling assembly including a plurality of fluid handling structures (cf. slots) according to the invention.

In FIG. 7a, the assembly includes a smaller number of individual slots compared to the example of FIG. 6. The assembly includes the following successive slots: X1-X2-X1-X3-X1-X2-X1-X3-X1. It will be appreciated that other configurations are also possible.

In FIG. 7b, the assembly includes a larger number of individual slots compared to the example of FIGS. 6 and 7a. The assembly includes the following successive slots: X1-X2-X1-13-X1-X2-X1-X3-X1-X2-X1-13-X1-X2-X1-X3-X1. Other configurations of the assembly are also possible. Advantageously, the gas phase deposition process can be significantly accelerated. Multiple gas phase deposition layers can be provided on a surface by a single stroke of the assembly with respect to the said surface.

Figure 7C:
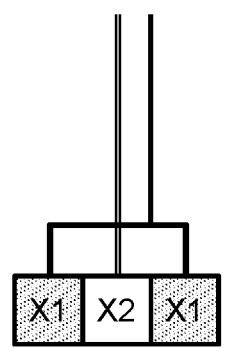

In FIG. 7c, the assembly includes a smaller number of individual slots compared to the example of FIGS. 6, 7a, and 7b. The assembly includes the following successive slots: X1-X2-X1. Other configurations of the assembly are also envisaged. For example X1-X2; X1-X2-X3; X1-X3-X1-X1-X3; X1-X2-X3-X1-X2-X3; etc.

The slots of the assembly may be arranged adjacent each other, or spaced apart with respect to each other. The assembly may form a head including the plurality of slots. The head can be movable with, respect to the surface. Additionally or alternatively, the surface may be movable with respect to the head (kinematic inversion). The head can deposit a plurality of layers by means of a single movement stroke. The achievable throughput for gas phase deposition can be significantly enhanced.

Figure 8A:
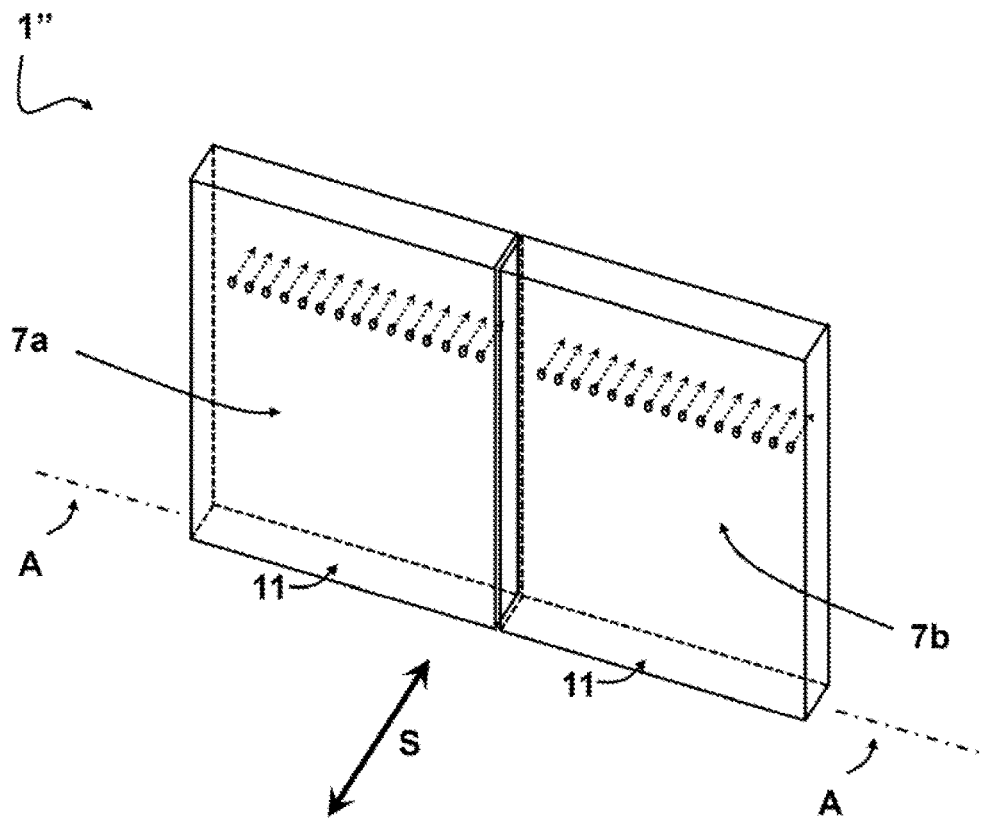
FIGS. 8a and 8b show a perspective view of a schematic diagram of an embodiment of a fluid handling structure.
Figure 8B:
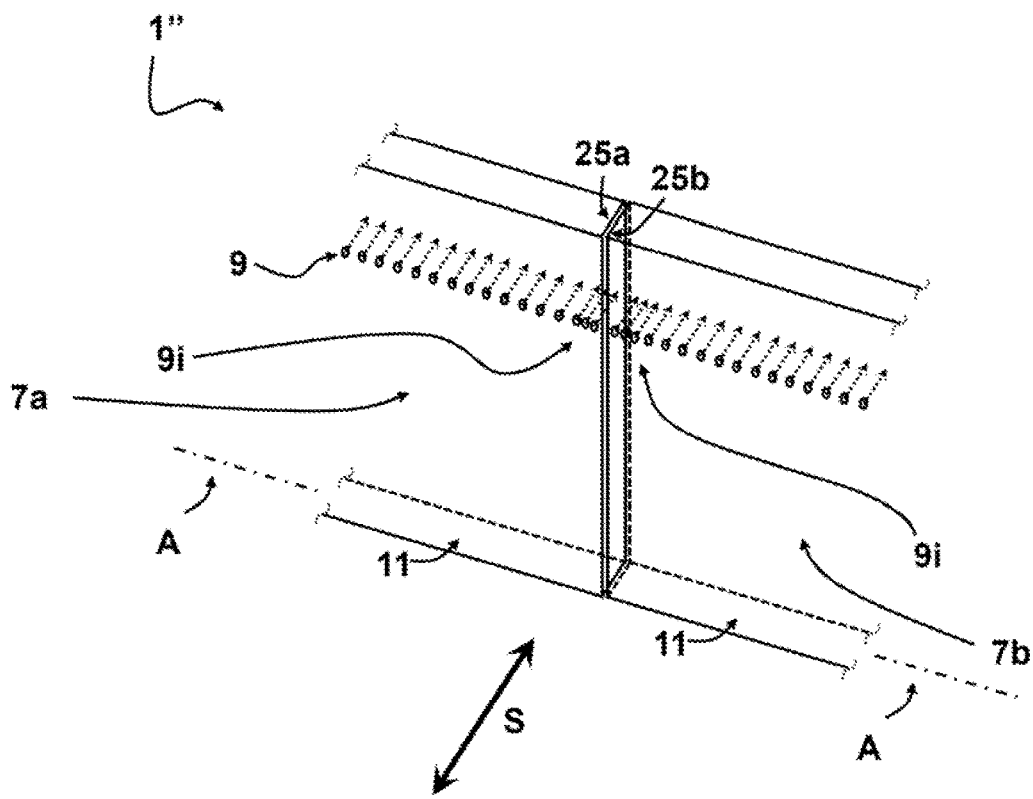

FIGS. 8a and 8b show a perspective view of a schematic diagram of an embodiment of a fluid handling structure 1". Elements having the same function and structure as those of the systems shown in any one of the other figures are given by identical or similar numerals, and a detailed explanation as to these elements will be omitted.

In this shown example of FIGS. 8a and 8b, the first and second elongated slits are arranged next to each other in a length direction of the first and second elongated slits, cf. transverse to a relative moving direction S of the fluid handling structure with respect to a to be treated surface 90 for gas phase deposition. In this way a larger area can be covered when the fluid handling structure is moved in the moving direction S. The first and second elongated slits 7a, 7b can be positioned adjacent each other as shown in FIGS. 8a and 8b. However, it is also possible that a small gap distance is provided between the first and second elongated slits 7a, 7b of the fluid handling structure 1".

In the embodiment shown in FIG. 8b, nozzles 9i are arranged closer together near a sidewall 25a, 25b of the elongated slit 7a, 7b of the fluid handling structure 1". A smaller pitch distance between the nozzles 9i is employed for compensating the reduced flow at the outlet 11 of the elongated slits as a result of increased flow resistance due to the respective sidewalls 25a, 25b). A sidewall 25a of the first elongated slit is positioned next to a sidewall 25b of the second elongated slit. However, it is also envisaged that one sidewall is employed between the first and second elongated slits 7a, 7b, i.e. the two elongated slits 7a, 7b sharing a sidewall (not shown).

The reduced flow output at the sides of the elongated slit can be effectively compensated by means of the reduced distance between successive nozzles 9i. However, additionally or alternatively, also the size of the nozzles can be chosen such as to compensate for the non-uniform flow at the outlet near the edges. For instance, the nozzles near the sidewalls 25a, 25b may have a larger diameter than the other nozzles (not shown in the FIG. 8).

It is also possible that more than two elongated slits are arranged next to each other in a length direction of the first and second elongated slits (cf. transverse to the relative moving direction of the fluid handling structure with respect to the to be treated surface 90).

Figure 9:
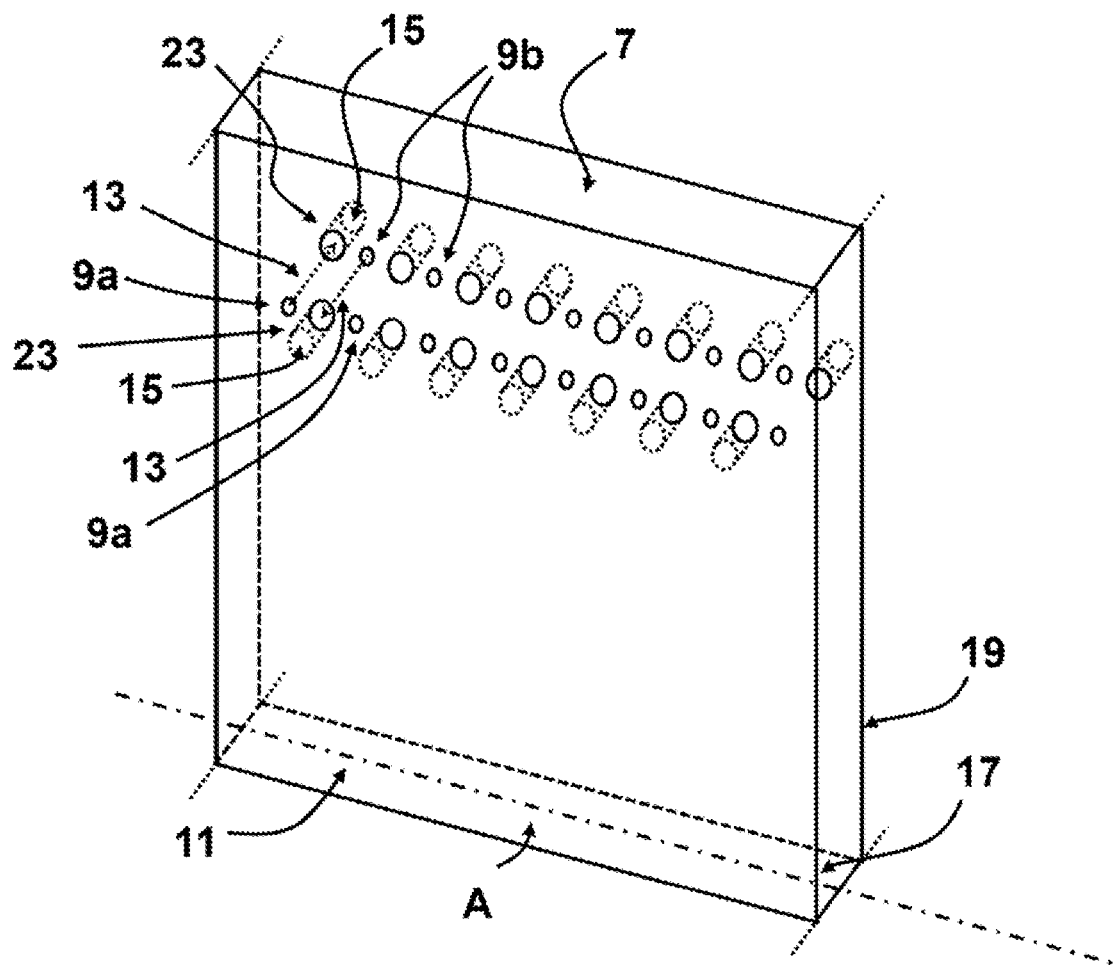
FIG. 9 shows a perspective view of a schematic diagram of an embodiment of a fluid handling structure.

FIG. 9 shows a perspective view of a schematic diagram of an embodiment of a fluid handling structure 1. In this example, both walls forming the elongated slit 7, i.e. the first wall 17 and the second wall 19, are provided with series of nozzles 9a, 9b. A first series of nozzles 9a is arranged on the first lateral wall 17 of the elongated slit 7, and a second series of nozzles 9b is arranged on a second lateral wall 19 of the elongated slit 7, the second lateral wall 19 of the elongated slit. being opposite the first lateral wall 17. The first series of nozzles 9a and the second series of nozzles 9b are configured to generate jets flowing in opposing directions whilst prevent contact between said opposing jets. For this purpose, the first and second series of nozzles 9a, 9b may be in a staggered arrangement with respect to each other. The jets 13 from the first and second series of nozzles 9a, 9b may thus flow in opposite directions without generating significant flow instabilities which can translate into flow velocity uniformity for the fluid discharged through the gap opening 11 of the elongated slit 7. The formed jets 13 can impinge the impingement surface 15 on the opposing wall. In this example, the impingement surfaces are located within potholes 23. Advantageously, an improved uniformly defined flow can be obtained over an entire length of the elongated slit.

The inlet 3 of the fluid structure 1 can be configured to provide pressurized fluid to the first and second series of nozzles 9a, 9b arranged on the first wall 17 and the second wall 19 respectively. The outlet of the fluid path formed by the fluid handling structure 1 may still be provided by means of the gap opening 11 of the elongated slit 7.

Figure 10:
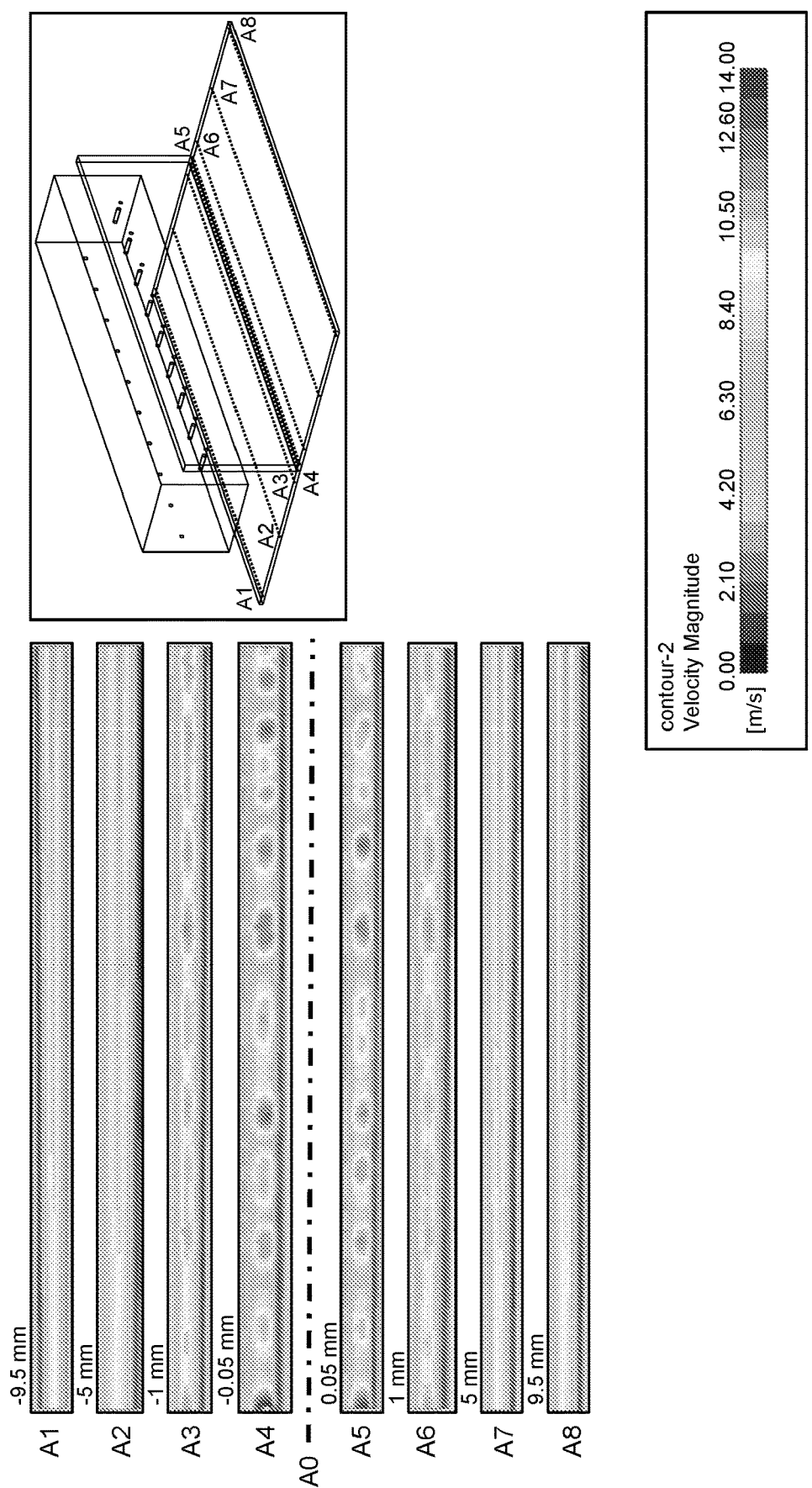
FIG. 10 shows a velocity profiles of fluid discharged from a fluid handling structure.

FIG. 10 shows a velocity profiles of fluid discharged from a fluid handling structure 1 without potholes 23. CFD computations and experiments have shown a more uniform supply of gasses with a combined nozzle and slit configuration as compared to the conventional slit design with manufacturing tolerances. In this example, the nozzles have a diameter of 0.2 millimeter forming a primary/main restriction in the flow path formed by the fluid handling structure 1. The nozzles are arranged in a straight array with a pitch distance of 2.5 millimeter. The distance between the array of nozzles 9 and the gap opening 11 of the elongated slit 7 is 5 millimeter. The gap opening 11 is positioned proximate a sample surface (e.g. substrate).

The substrate and the fluid handling structure 1 can move with respect to each other during a gas phase deposition process. Collette flow is the flow of a viscous fluid in the space between two surfaces, one of which is moving tangentially relative to the other. It is desirable for the flow to be greater than a drag flow resulting from the movement. Therefore, in this example, the flow rate Q is selected as 10*Qcouette.

Velocity contour plots A1-A8 transverse to the sample surface at locations with respect to the center of the gap opening A0 are plotted illustrating the uniformity of the flow. The jets can result in local velocity fluctuations when increasing the mass flow. The velocity contour plots are obtained using computational fluid dynamics.

Figure 11:
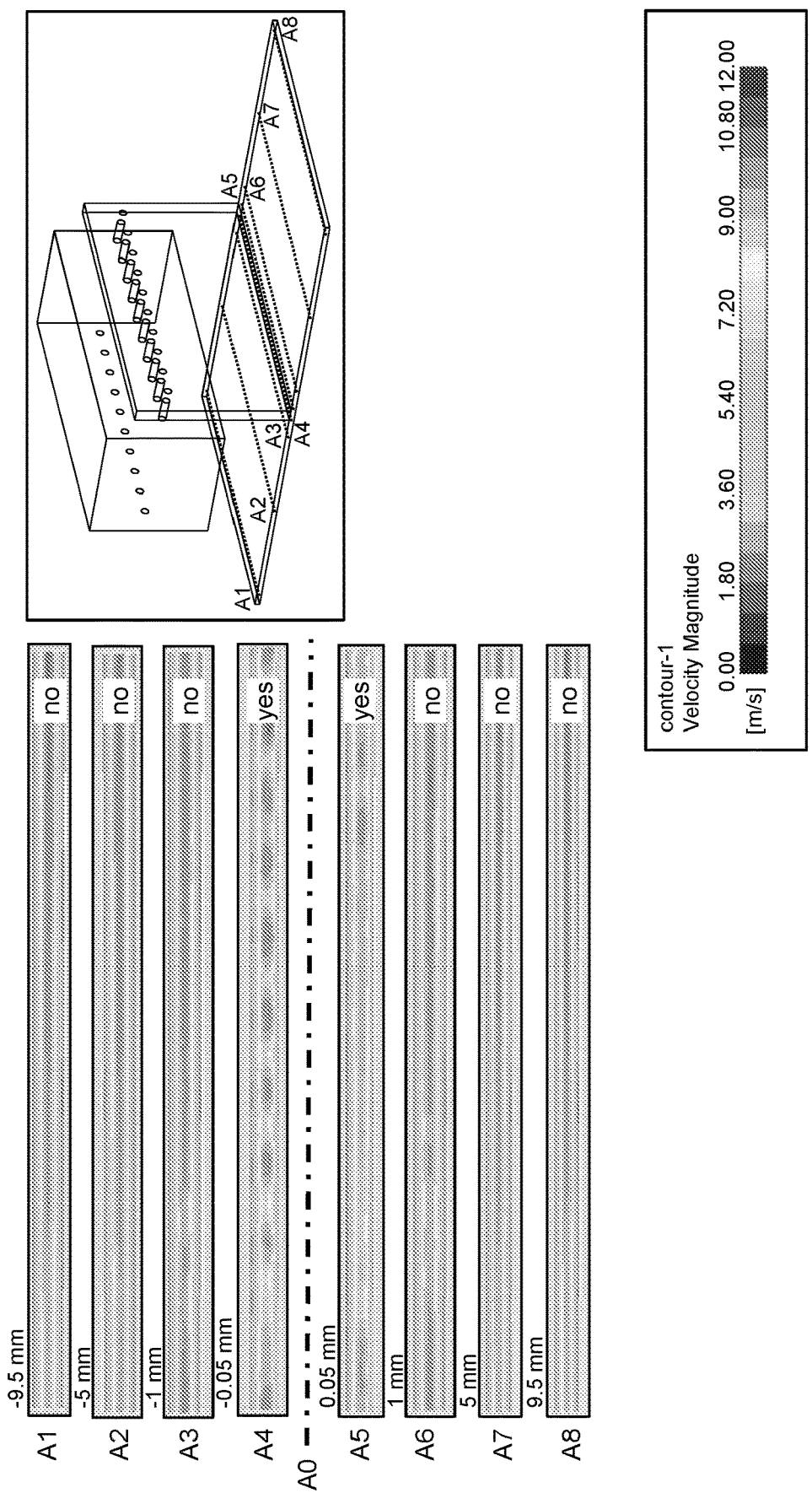
FIG. 11 shows a velocity profiles of fluid discharged from a fluid handling structure.

FIG. 11 shows a velocity profiles of fluid discharged from a fluid handling structure 1 without potholes 23. The nozzles have a diameter of 0.3 millimeter forming a primary/main restriction in the flow path formed by the fluid handling structure 1. The nozzles are arranged in a straight array with a pitch distance of 1.25 millimeter. The distance between the array of nozzles 9 and the gap opening 11 of the elongated slit 7 is 5 millimeter. In this example, the flow rate Q=10*Qcouette. The gap opening 11 is positioned proximate a sample surface (e.g. substrate). Velocity contour plots at different distances from the center of the gap opening are plotted illustrating the uniformity of the flow.

It can be observed that the fluid is dispersed more evenly throughout the gap opening of the elongated slit towards the surface of the sample than compared to the situation shown in FIG. 10. Increasing the jet diameter and the number of nozzles can result in less velocity fluctuations.

Figure 12:
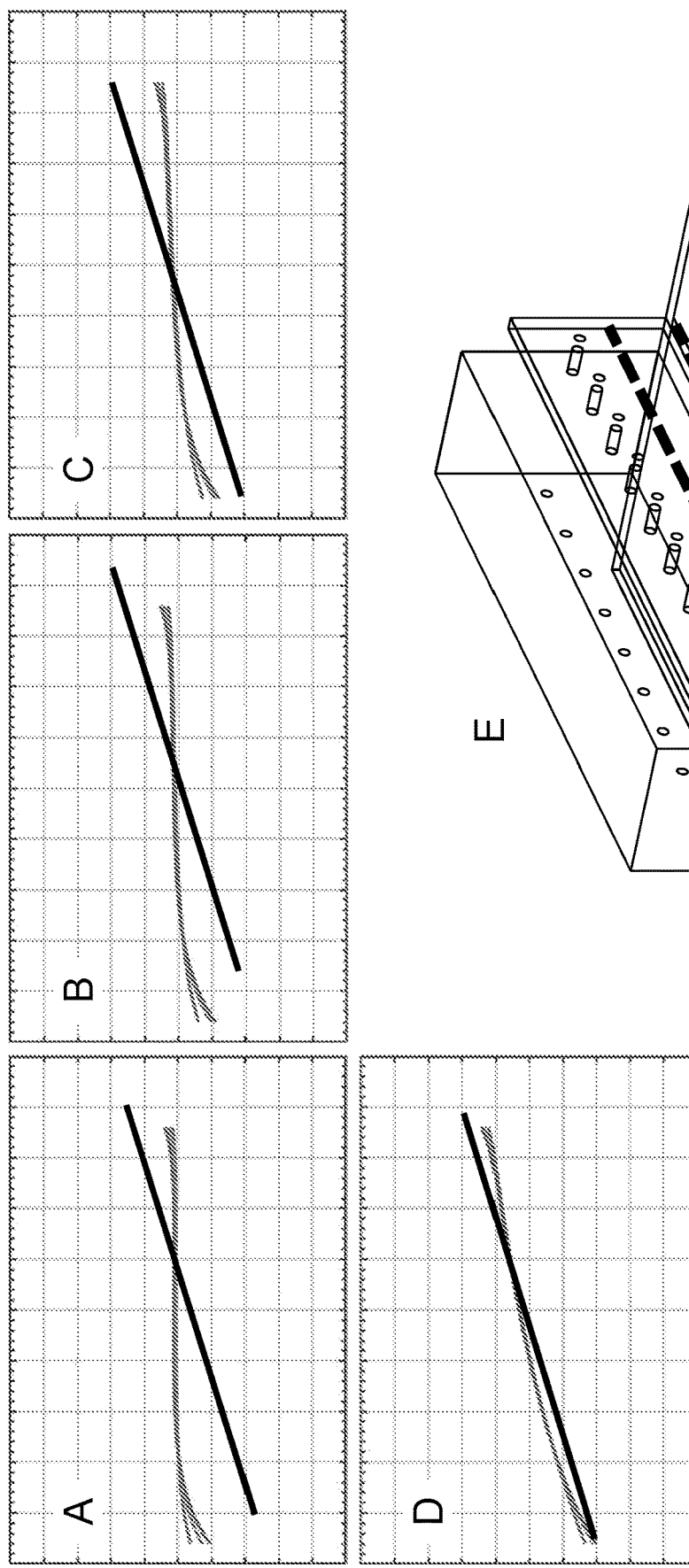
FIGS. 12 (A-E) illustrates flow uniformity obtained by a fluid handling structure.

FIGS. 12A to 12D show graphs indicating flow uniformity. In FIG. 12E a schematic representation of the fluid handling structure is illustrated. A network model is used to calculate a influence of gap height on the flow uniformity for different nozzle dimensions for a model (See FIG. 12E) with a gap distance IHGap of about 200+−40 micrometer, and a width of about 225 mm. A distance between the gap opening 11 of the elongated slit 7 and the surface may vary as a result of inaccuracies, alignment problems, etc. In this way a wedge can be formed having influence on the flow discharged through the gap opening 11 of the elongated slit 7. In FIG. 12A, a nozzle diameter is used of 200 micrometer, wherein the gap is substantially equal. For different scenarios it was calculated that the flow is substantially unchanged for increasing wedge, e.g. over a range from 0.025 to 0.225 mm; resulting in a flow variation of about 6%. For a slightly larger diameter, the flow increased somewhat to 8% for increasing wedges in the same order, where the flow still is reasonably independent of the IHgap. For larger and larger diameters, the flow increases to 10% (FIG. 12C) and 20% (FIG. 12D) and the flow response becomes substantially linear with the wedge increase.

Figure 13A:
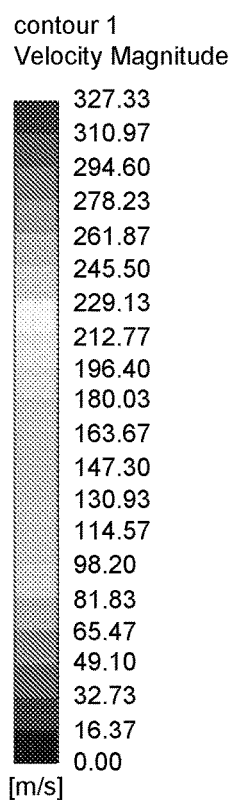
FIGS. 13a and 13b show a velocity profile of fluid flowing in a cross section of the fluid handling structure.
Figure 13B:
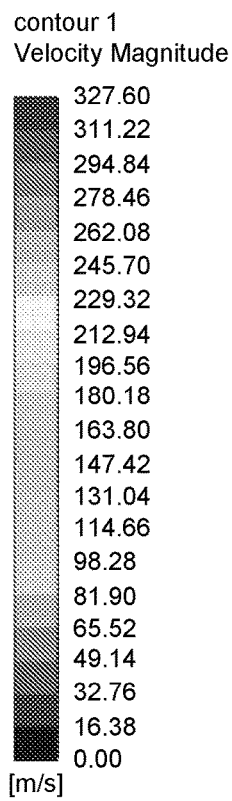

FIGS. 13a and 13b show a velocity profile of fluid flowing in a cross section of the fluid handling structure 1. The flow of fluid from the inlet 3 (e.g. inlet chamber) may be directed to the elongated slit 7 via the series of nozzles 9. A greater degree of restriction is provided by the series of nozzles 9. The flow of fluid in the elongated slit 7 can become more uniform when the gap opening is approached. In FIG. 13a, the fluid handling structure does not include potholes 23. In FIG. 13b, a pothole is arranged opposite the nozzle 9. The distance between the series of nozzles 9 and the gap opening 11 of the elongated slit (i.e. nozzle height) is 5 millimeter; the slit width, i.e. the distance between the first wall 17 and the second wall 19 is 0.5 millimeter; the diameter of the pothole is 1 millimeter; the diameter of the nozzle is 0.2 millimeter; the length of the pothole is 2 millimeter; and the mass flow is 10 times Qcouette. The area of the nozzle is 3.1415 e-8 m2 and the annular area is 7.539 e-7 m2. It will be appreciated that other dimensions can also be employed.

It can be observed that the exit velocity is reduced by injecting the fluid in a pothole, positioned opposite to the nozzle (cf. FIG. 13b). The outflow velocity is reduced with 96 percent with respect to the fluid handling structure without potholes (cf. FIG. 13a).

Figure 14A:
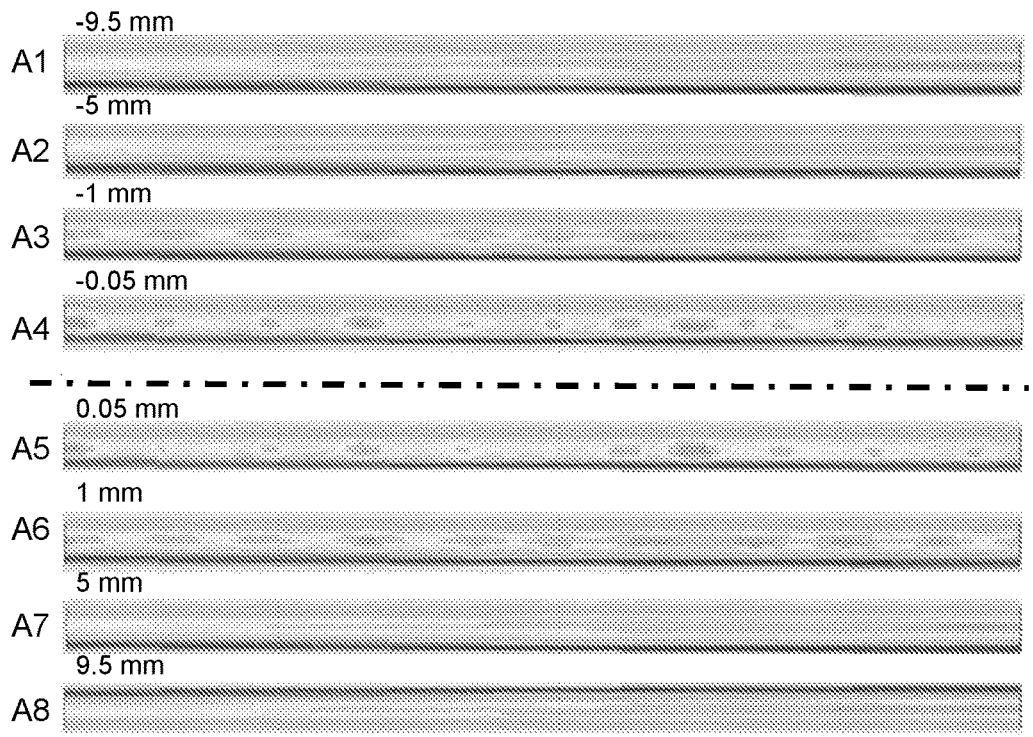
FIGS. 14a and 14b show velocity profiles of fluid discharged from a fluid handling structure.
Figure 14B:
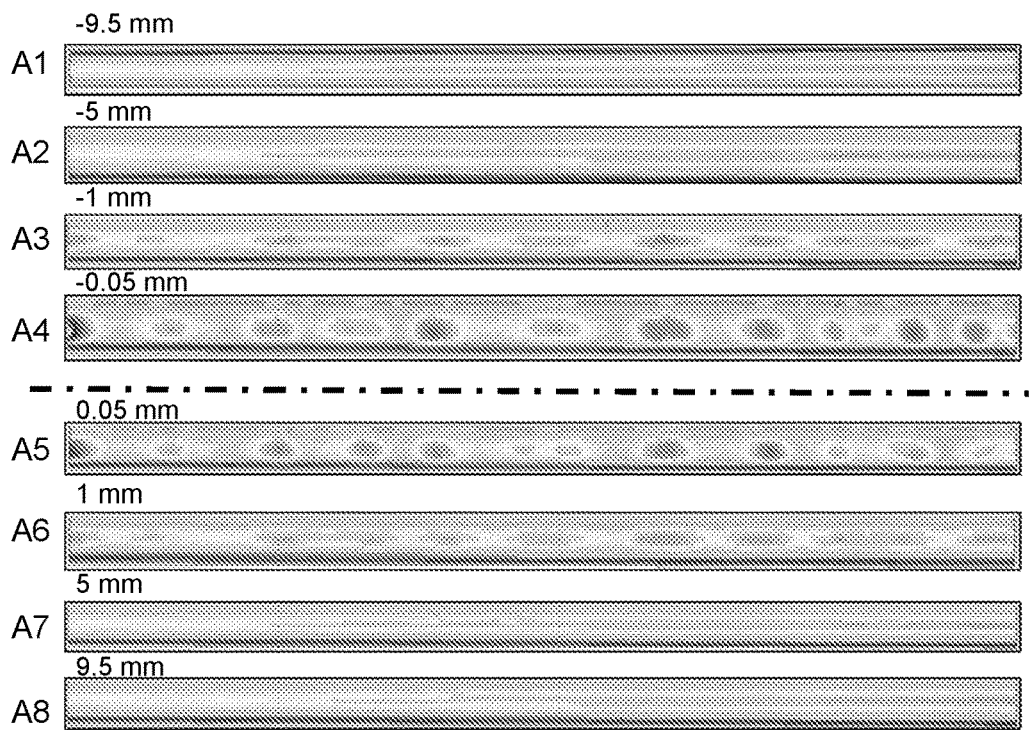

FIGS. 14a and 14b show velocity profiles of fluid discharged from a fluid handling structure 1, at cross sectional planes at locations similar to the examples shown in FIGS. 10 and 11. FIG. 14a shows the resulting velocity profiles for an embodiment with potholes. FIG. 14b shows the resulting velocity profiles for an embodiment without potholes, wherein the formed jets from the nozzles impinge on the second wall 17. In this example, the diameter of the nozzles is 0.2 millimeter, the slit height (distance of nozzles to gap opening 11) is 5 millimeter, the diameter of the potholes is 1 millimeter (only for example in FIG. 14a), and the flow rate is Q=10Qcouette. It can be observed that the velocity fluctuations reduce significantly by directing the nozzle jets in respective potholes. The velocity profiles closer to the slit are more uniform (e.g. at +0.05 millimeter and −0.05 millimeter from the slit center line in longitudinal direction).

Figure 15:
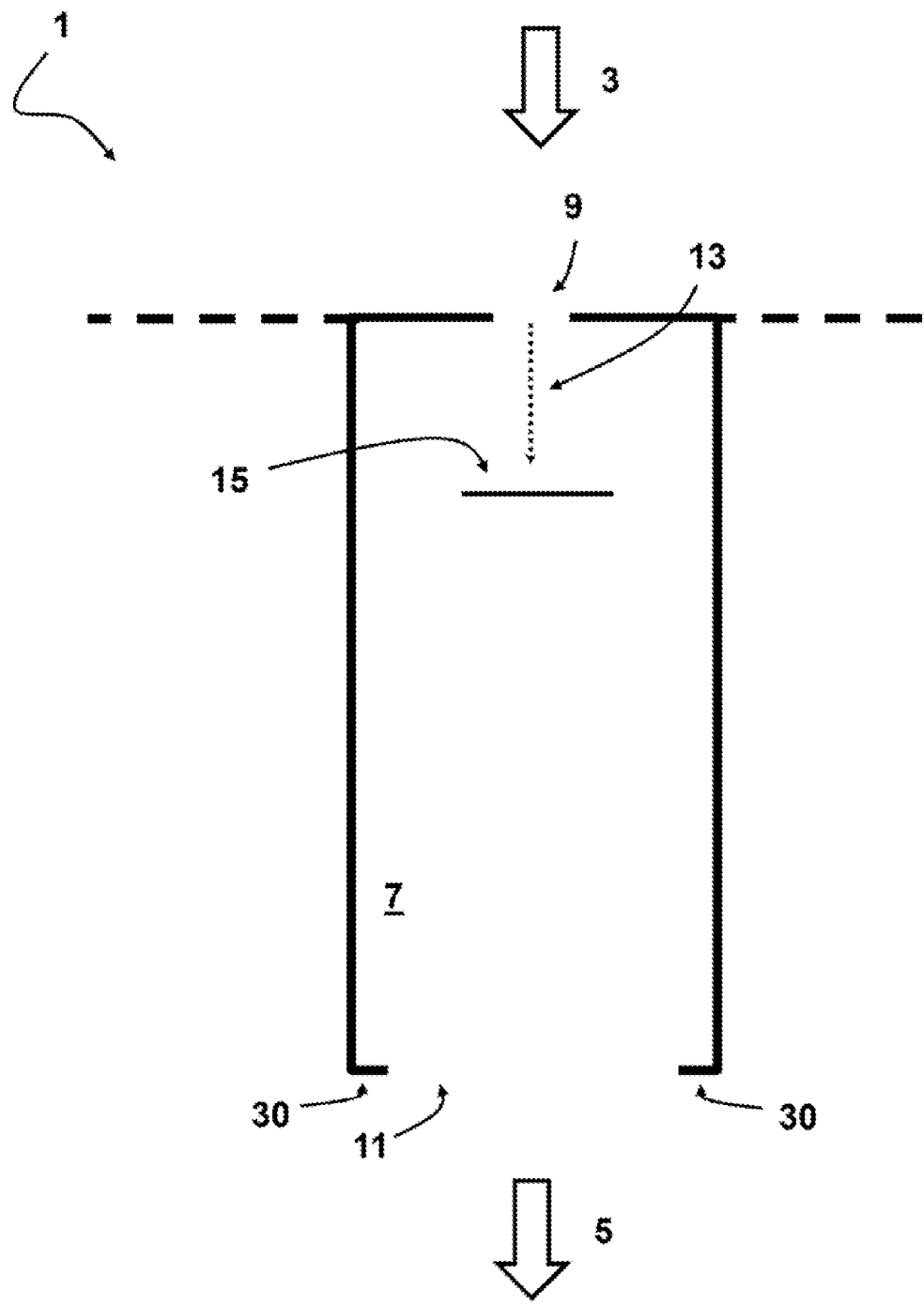
FIG. 15 shows a schematic diagram of an embodiment of a fluid handling structure.

FIG. 15 shows a cross section of a schematic diagram of an embodiment of a fluid handling structure 1. The structure 1 defines a flow path with an inlet 3 and an outlet 5 for transmitting pressurized fluid from said inlet 3 to the outlet 5. The structure 1 includes an elongated slit 7 and a series of nozzles 9 through which pressurized fluid is allowed to enter the elongated slit 7. The inlet 3 of the fluid handling structure 1 is positioned upstream the series of nozzles 9 in the flow path defined by said fluid handling structure 1. The outlet 5 is formed downstream in the flow path, at a gap opening 11 of the elongated slit 7, through which pressurized fluid is allowed to discharge from the elongated slit 7. The series of nozzles 9 are configured to provide a larger flow resistance than the elongated slit 7. The series of nozzles 9 are adapted to form a series of jet flows 13 directed towards one or more impingement surfaces 15 of the structure 1 when pressurized fluid is transmitted through the flow path. In this example, impingement surface is formed within the slit 7. Furthermore, the gap opening 11 of the elongated slit 7 is narrowed by means of additional slit rims 30.

The inlet chamber can be fluidly coupled to the elongated slit via the primary flow path restriction formed by the series of nozzles 9. A main pressure drop may be achieved across the primary flow path restriction. The fluid inlet may be fluidly coupled to a fluid providing system configured to provide pressurized fluid to the inlet chamber of the fluid handling structure 1.

Contrary to a conventional slit-based gas handling structure, the dominant restriction is provided by means of the series of nozzles 9. The slit has a lower restrictiveness than the series of nozzles 9. In this way, it can be prevented that manufacturing tolerances in slit width (out of plane) can lead to significant flow variations. The dominant restriction can be accurately achieved by means of small hole-based nozzles. Holes have much more relaxed manufacturing tolerances than slits. The slit can in the fluid handling structure can thus become wider in the design.

Figure 16:
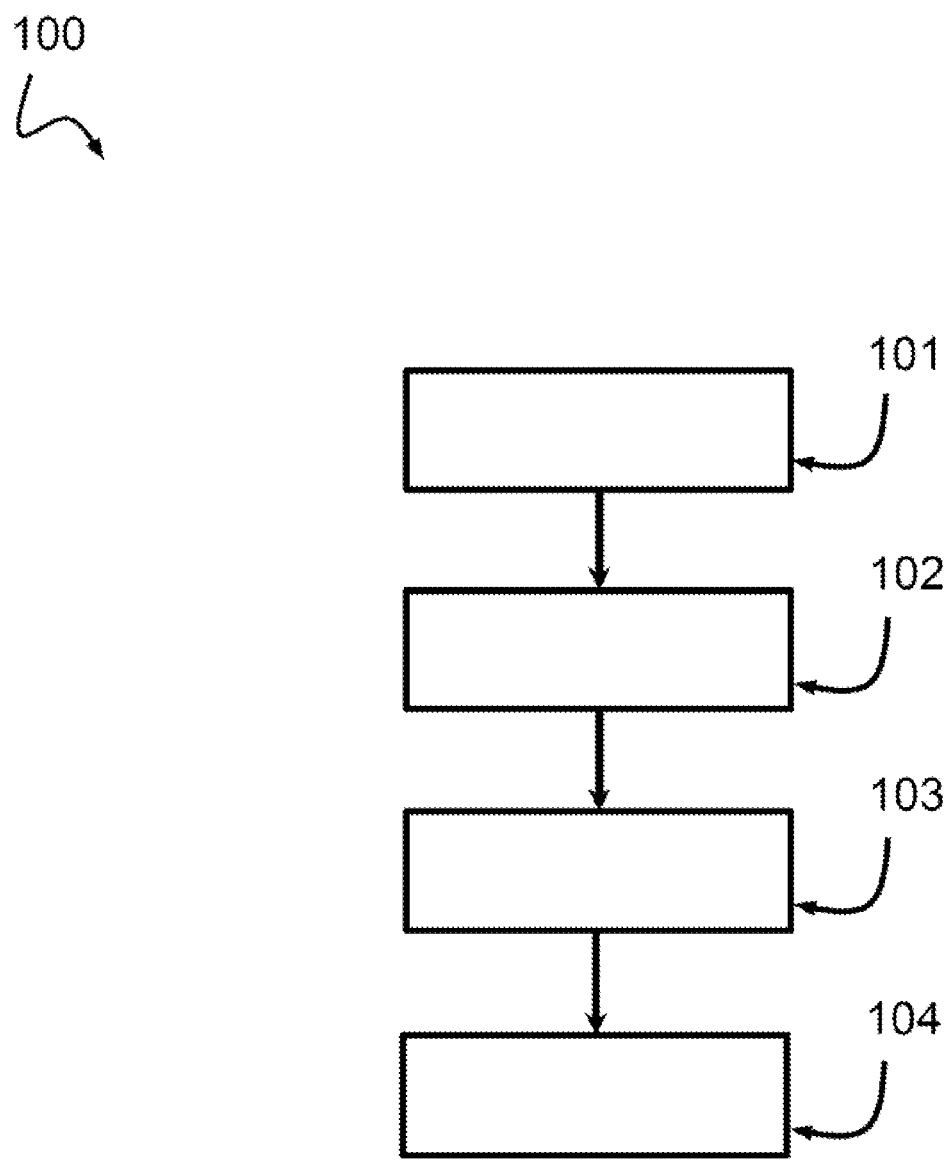
FIG. 16 shows a schematic diagram of a method.

FIG. 16 shows a schematic diagram of a method 100 for handling fluid in a gas phase deposition apparatus. In a first step 101, a flow path is defined through which pressurized fluid is allowed to flow, the flow path having an inlet, a series of nozzles, an elongated slit and an outlet, wherein the inlet is upstream relative to the series of nozzles, and wherein the outlet is formed downstream at a gap opening of the elongated slit. In a second step 102, a pressurized fluid is supplied to the inlet of the flow path, the series of nozzles being configured to form a series of jets. In a third step 103, the series of jets are directed into the elongated slit. In a fourth step 104, the formed series of jets, within the elongated slit, are impinged against an impingement surface. The series of nozzles are configured to provide a larger flow resistance than the elongated slit. The series of nozzles form a dominant restriction within the flow path.

The nozzles 9 may be formed by orifices or through holes. Orifices can be made very accurately up to a few micrometers. It is much more difficult to obtain such accuracy with an elongated slit. The slit is much more sensitive to tolerance manufacturing errors.

It will be appreciated that the sequence of operations (or steps) is not limited to the order presented in the figures and/or claims unless specifically indicated otherwise.

It will be appreciated that the cavity may have various shapes and forms. The cavity may for instance form at least one of an opening, an indentation, a hole, a depression or a pothole. Various opening shapes are possible, for instance round, ellipsoid, circular, rectangular, square, etc. Other shapes are also possible, for instance slit or groove shapes. It will be clear to the skilled person that a circular pothole may be easy and accurate to manufacture. In this way the costs involved in the manufacturing may be reduced.

"Optional" or "optionally" means that the subsequently described event or circumstance may or may not occur, and that the description includes instances where said event or circumstance occurs and instances where it does not.

It should be noticed that the invention may be relatively easy to produce and that even the cost linked to implementing the invention is not very high. The invention described above may be modified and adapted in several ways without thereby departing from the scope of the inventive concept.

Herein, the invention is described with reference to specific examples of embodiments of the invention. It will, however, be evident that various modifications, variations, alternatives and changes may be made therein, without departing from the essence of the invention. For the purpose of clarity and a concise description features are described herein as part of the same or separate embodiments, however, alternative embodiments having combinations of all or some of the features described in these separate embodiments are also envisaged and understood to fall within the framework of the invention as outlined by the claims. The specifications, figures and examples are, accordingly, to be regarded in an illustrative sense rather than in a restrictive sense. The invention is intended to embrace all alternatives, modifications and variations which fall within the spirit and scope of the appended claims. Further, many of the elements that are described are functional entities that may be implemented as discrete or distributed components or in conjunction with other components, in any suitable combination and location.

In the claims, any reference signs placed between parentheses shall not be construed as limiting the claim. The word 'comprising' does not exclude the presence of other features or steps than those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to an advantage.

The invention claimed is:

1. A fluid handling structure (structure) for a gas phase deposition apparatus, the structure defining a flow path with an inlet and an outlet for transmitting pressurized fluid from said inlet to the outlet,
   wherein the structure includes:
      an elongated slit, and
      a series of nozzles through which pressurized fluid is allowed to enter the elongated slit,
   wherein the inlet is upstream the series of nozzles,
   wherein the outlet is formed downstream at a gap opening of the elongated slit allowing pressurized fluid to discharge from the elongated slit,
   wherein the series of nozzles provide a larger flow resistance than the elongated slit,
   wherein the series of nozzles form a series of jet flows directed towards one or more impingement surfaces of the structure as pressurized fluid is transmitted through the flow path,
   wherein the elongate slit is defined between a first wall and a second wall spaced across a gap from the first wall, and
   wherein the second wall includes a series of cavities arranged for receiving the formed jets as pressurized fluid is transmitted through the flow path, and wherein the impingement surfaces are formed by the series of cavities.

2. The fluid handling structure according to claim 1, wherein the nozzles are configured to provide a flow resistance larger than or equal to a flow resistance between the elongated slit and the substrate.

3. The fluid handling structure according to claim 1, wherein the series of nozzles are spatially offset with respect to each other in an array, and wherein the array substantially extends in a length direction of the elongated slit.

4. The fluid handling structure according to claim 1, wherein the series of nozzles have a diameter in a range of 200 to 700 micrometer.

5. The fluid handling structure according to claim 1, wherein a distance between the series of nozzles and the gap opening is in a range of 2.5-25 millimeter.

6. The fluid handling structure according to claim 1, wherein the series of nozzles and the gap opening are spaced in a range between 0.1-10 millimeter.

7. The fluid handling structure according to claim 1, wherein the series of cavities on the second wall are arranged opposite the series of nozzles on the first wall.

8. The fluid handling structure according to claim 1, wherein each cavity of the series of cavities has:
a diameter in a range of 0.5 to 2 millimeter, and
a length in a range of 0.5 to 5 millimeter.

9. The fluid handling structure according to claim 1, wherein the elongated slit is configured to break larger vortices down into smaller vortices.

10. A method for improving homogeneity of fluid flows for gas phase deposition on substrates, wherein the method includes introducing a fluid using a fluid handling structure (structure) defining a flow path with an inlet and an outlet for transmitting pressurized fluid from said inlet to the outlet onto a substrate,
wherein the structure includes:
an elongated slit, and
a series of nozzles through which pressurized fluid is allowed to enter the elongated slit,
wherein the inlet is provided upstream the series of nozzles,
wherein the outlet is formed downstream at a gap opening of the elongated slit allowing pressurized fluid to discharge from the elongated slit,
wherein the series of nozzles provide a larger flow resistance than the elongated slit,
wherein the series of nozzles form a series of jet flows directed towards one or more impingement surfaces of the structure as pressurized fluid is transmitted through the flow path,
wherein the elongate slit is defined between a first wall and a second wall spaced across a gap from the first wall, and
wherein the second wall includes a series of cavities arranged for receiving the formed jets as pressurized fluid is transmitted through the flow path, and wherein the impingement surfaces are formed by the series of cavities.

11. A fluid delivery head for use in a gas phase deposition system, the fluid delivery head including the fluid handling structure according to claim 1.

12. The fluid handling structure of claim 5, wherein the distance between the series of nozzles and the gap opening is in a range of 5-10 millimeter.

13. The fluid handling structure of claim 5, wherein the series of nozzles and the gap opening are spaced in a range of 2.5-5 millimeter.

14. The fluid handling structure of claim 1, wherein each of the series of nozzles has a diameter smaller than 400 micrometer.

15. The method of claim 10, wherein each of the series of nozzles has a diameter smaller than 400 micrometer.

16. The method of claim 10, wherein the nozzles are configured to provide a flow resistance larger than or equal to a flow resistance between the elongated slit and the substrate.

17. The method claim 10, wherein the series of nozzles are spatially offset with respect to each other in an array, and wherein the array substantially extends in a length direction of the elongated slit.

18. The method of claim 10, wherein the series of cavities on the second wall are arranged opposite the series of nozzles on the first wall.

19. The method of claim 10, wherein each cavity of the series of cavities has:
a diameter in a range of 0.5 to 2 millimeter, and
a length in a range of 0.5 to 5 millimeter.

20. The method of claim 10, wherein the elongated slit is configured to break larger vortices down into smaller vortices.

* * * * *